United States Patent [19]
Black

[11] Patent Number: 5,861,769
[45] Date of Patent: *Jan. 19, 1999

[54] DISTRIBUTED RAMP DELAY GENERATOR

[75] Inventor: Alistair D. Black, Los Gatos, Calif.

[73] Assignee: Vitesse Semiconductor Corporation, Camarillo, Calif.

[ * ] Notice: The term of this patent shall not extend beyond the expiration date of Pat. No. 5,694,070.

[21] Appl. No.: 957,437

[22] Filed: Oct. 24, 1997

Related U.S. Application Data

[63] Continuation of Ser. No. 273,572, Jul. 11, 1994, Pat. No. 5,694,070.

[51] Int. Cl.$^6$ .................................................. H03H 11/26
[52] U.S. Cl. ......................... 327/264; 326/266; 326/278; 326/280
[58] Field of Search .................................... 327/264, 266, 327/278, 280

Primary Examiner—Margaret Rose Wambach
Attorney, Agent, or Firm—Irell & Manella LLP

[57] ABSTRACT

A series delay generator for imposing a programmable delay on the timing edges of an incoming waveform is disclosed. The magnitude of the imposed delay is proportional to the value of a binary programming word. The series delay generator is implemented as a series of delay cells, each of which can be programmed into two delay states, a maximum delay and a minimum delay. The magnitude of the maximum and minimum delays can be set and calibrated using an analog tuning voltage. The series of delay cells can be segmentized in order to provide pipelined operation. The series delay generator is therefore capable of processing more than one timing edge at a time, permitting its minimum reprogramming time to span and even exceed the maximum delay span of the generator. A delay cell is also disclosed that uses a differential input and a digitally controlled current balance circuit to advance and retard the zero crossings of the incoming waveform and its inverse. The output is fed back to the digital control input to reduce pulse width distortion of the incoming waveform. Cells using a double-balanced and single-balanced current balance circuit are disclosed.

20 Claims, 20 Drawing Sheets

RAMP DELAY GENERATOR
PRIOR ART

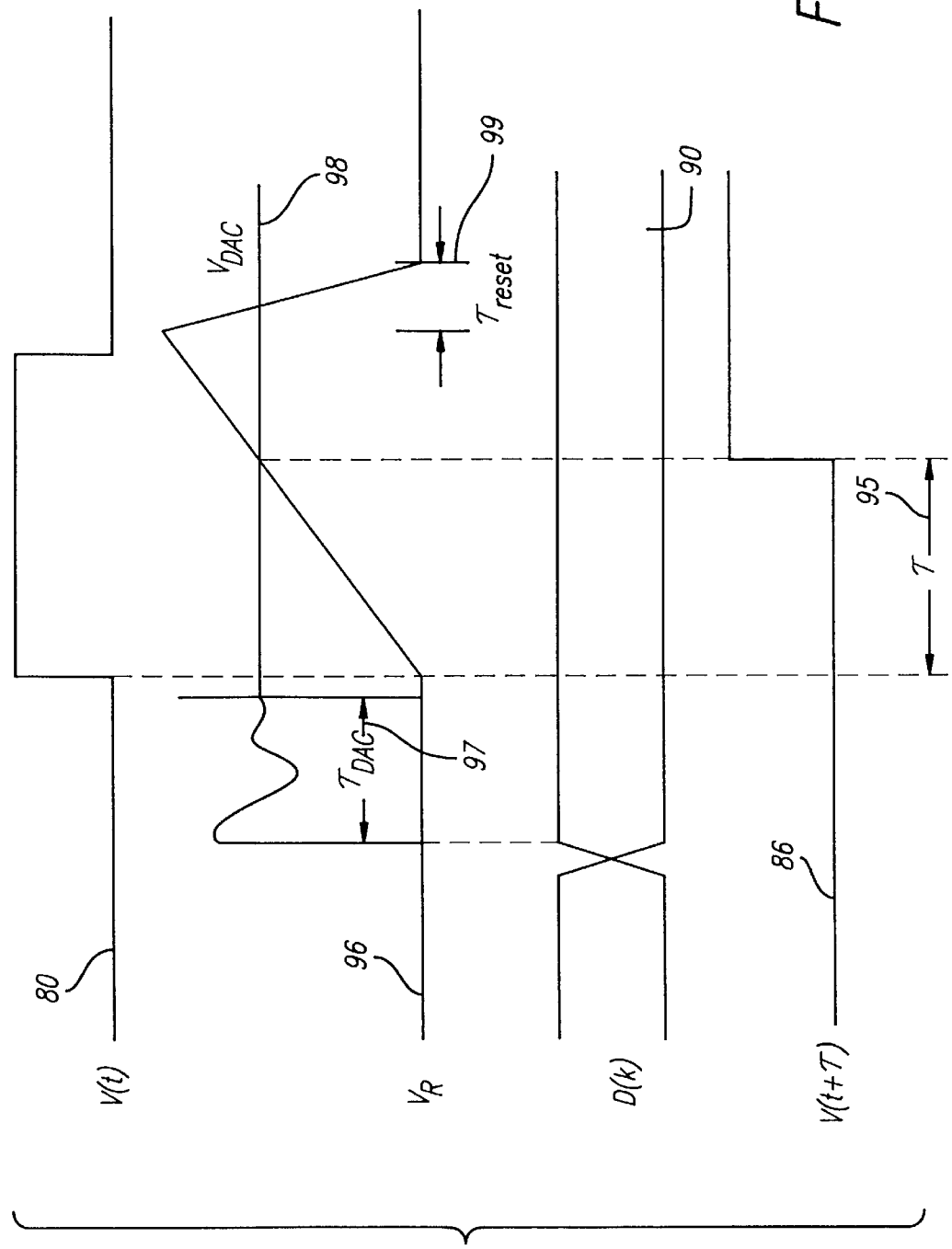

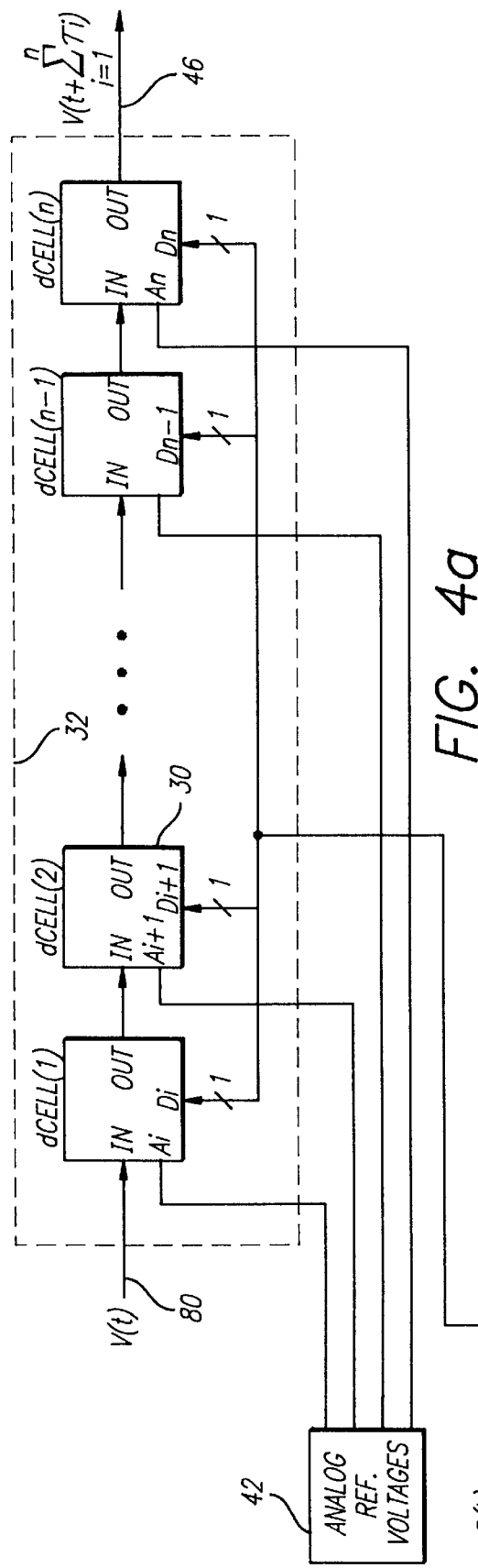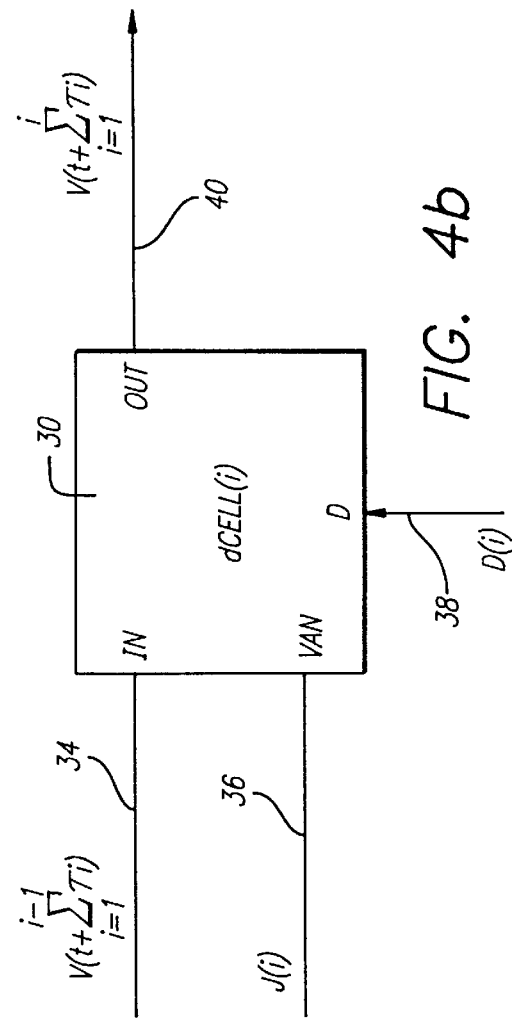
FIG. 4a
FIG. 4b

DISTRIBUTED RAMP DELAY GENERATOR

This is a continuation of application Ser. No. 08/273,572, filed Jul. 11, 1994 now U.S. Pat. No. 5,694,070.

BACKGROUND OF THE INVENTION

1. Field of the Invention

The present invention relates to a method and apparatus for imposing onto an incoming signal a time delay the magnitude of which is digitally programmable, and more particularly to a method and apparatus for producing the time delay as a summation of a series of smaller delays to maximize the frequency at which delays may be digitally programmed.

2. Description of the Related Art

Digital delay generators are commonly employed in instrumentation, automated test equipment and communications contexts. A typical automated test application involves the introduction of a variable delay to a timing edge which is then supplied to a circuit under test. The circuit can be observed to ascertain the effect of the delay on its operation.

A typical communications application involves the transmission of data encoded in the phase modulation of a periodic waveform. The phase of the periodic waveform is varied as a direct function of the numerical value of a digital word comprising a digital data stream. Thus, the information transmitted as a digital data stream is encoded in the phase of the periodic waveform, the periodic waveform being less susceptible to distortion during transmission over long distances. As an example, various phase modulation formats are employed by modern computer modems to transmit digital data streams over telephone lines.

Generally, a digital delay generator is an electronic circuit which receives as inputs: an incoming input signal the timing edges of which are to be delayed, and a digital data stream the numerical values of which define the magnitude of the delay for each period or timing edge (i.e. rising edge) of the input signal. The delay generator provides an output which is essentially the input signal with its periods or timing edges delayed in accordance with binary values encoded within the digital data stream. The data stream is typically organized into digital words comprising multiple bits so that a plurality of possible delay values can be encoded for each period or timing edge of the incoming waveform.

An illustration of a generic digital delay generator used to modulate the phase of a periodic waveform is illustrated with reference to FIGS. 1a, 1b and 1c. FIG. 1a is a block diagram depiction of a generic prior art digital delay generator 10. The periodic waveform to be delayed (i.e. modulated) is a pulse train V(t) which is fixed in frequency and is present at input 12 of delay generator 10. The pulse train input 22 is illustrated in FIG. 1c. A digital data stream D(k) representing the binary information to be encoded as delays in the periodic waveform is presented at input 14 of delay generator 10, and is represented in FIG. 1c as waveform 26.

With each rising edge (i.e. timing edge) of the period waveform 22 at input 12 of delay generator 10, a new digital word D(k) comprising N bits from data stream 26 is read into the delay generator 10 through input 14. The leading or timing edge of each pulse then appears at output 13 of delay generator 10, subject to a delay ($\tau$), the magnitude of which is proportional to the value of the digital word D(k) read from digital data stream 26 and which is associated with that timing edge. The delayed output is illustrated in FIG. 1c as waveform 24. The output is represented as V(t+$\tau$), where $\tau$ for a given value of D(k) is equal to $\tau_{min}$+D(k)q. $\tau_{min}$ is the minimum delay through the circuit due to circuit propagation delay and q is the resolution of the delay circuit. This relationship is illustrated in FIG. 1b.

FIG. 1c illustrates the relationship between the incoming waveform V(t) 22 and the output waveform V(t+$\tau$) 24. Each timing or rising edge of V(t) 12 is delayed by some delay 28 that corresponds to the value of D(k) 26 at the time the edge entered the Delay Generator 10.

Typical digital delay generators are implementable in numerous circuit configurations and in numerous circuit technologies used for manufacturing integrated circuits, including complementary metal-oxide-semiconductor (CMOS), silicon bipolar and gallium arsenide.

A typical implementation of a prior art delay generator, sometimes known as a ramp delay generator, is illustrated in FIG. 2a. An incoming waveform V(t) 80 is presented at the input of a ramp generator circuit 82. The incoming waveform 80 can be a pulse train as shown in FIG. 2b. Ramp generator 82 is triggered to produce a ramping output voltage $V_R$ 96 (FIG. 2b) by each timing edge (i.e. a rising edge) of pulse train 80, as the magnitude of V(t) 80 exceeds some threshold value. Just prior to each timing edge of incoming waveform 80, one or more bits of data stream D(k) 90 (FIG. 2b) are latched into digital-to-analog converter (DAC) 92. DAC 92 then outputs a voltage $V_{DAC}$ 98 which is (virtually) linearly proportional to the binary value of the input word D(k) 90. $V_{DAC}$ 98 is presented to the negative input of Comparator 84 and $V_R$ 96 is presented to the positive input of Comparator 84.

While $V_R$ 96 remains less than the magnitude of DAC output voltage $V_{DAC}$ 98, the output voltage V(t+$\tau$) 86 of comparator 84 remains low. When the magnitude of ramping output voltage $V_R$ 96 exceeds DAC output voltage $V_{DAC}$ 98, comparator output voltage V(t+$\tau$) 86 switches high and remains high until the ramp generator circuit 82 is reset, causing the magnitude of its output voltage $V_R$ 96 to return to zero.

Because the magnitude of ramp generator output voltage $V_R$ 96 is virtually linear with respect to time (i.e. $V_R$=dv/dt ($\Delta$t)), its amplitude is directly proportional to the time which has elapsed since the ramp generator 82 was last triggered by a timing edge. Thus, DAC 92 controls the magnitude of the delay imposed on a timing edge of incoming waveform 80 to create output waveform V(t+$\tau$) 86 as a function of the binary value of the input word D(k) 90 through $V_{DAC}$ 98. The operation of the ramp delay generator of FIG. 2a is illustrated by the waveforms of FIG. 2b.

For virtually any delay generator, there will always be some minimum delay $\tau_{min}$ introduced between the timing edges of an input waveform and the output waveform due to circuit propagation delays. For the ramp delay generator of FIG. 2a, even if D(k) 90 is a binary zero such that $V_{DAC}$ 98 is zero and the ramp time is virtually zero, there will be a delay ($\tau$=$\tau_{min}$) associated with the propagation of the incoming waveform through the circuitry comprising the ramp generator 82 and Comparator 84. Thus, the programmable delay of a delay generator is the net delay $\tau_{net}$=$\tau$−$\tau_{min}$, and its programmable delay range $\tau_R$ is equal to the difference between its maximum delay ($\tau_{max}$) and its minimum delay ($\tau_{min}$).

The fastest rate at which a delay generator can be reprogrammed with a digital word representing a new delay value is typically referred to as the maximum reprogramming rate.

For the ramp delay generator of FIG. 2a, ramp generator circuit 82 cannot be retriggered until, at a minimum, a time equal to the maximum programmable delay range $\tau_R = \tau_{max} - \tau_{min}$ has elapsed. Ramp generator 82 also cannot be retriggered until the value of $V_{DAC}$ 98 corresponding to the new value of D(k) 90 has settled sufficiently to provide an accurate and stable switch point for Comparator 84. Finally, the ramp generator 82 cannot be retriggered until it has been completely reset to zero upon completion of the previous delay period.

Typically, the DAC settling time $\tau_{DAC}$ 97, FIG. 2b is equal to or greater than the ramp generator reset time $\tau_{reset}$ 99, FIG. 2b, so that the maximum reprogramming rate is equal to $1/(\tau_R + \tau_{DAC})$. The greater the number of bits comprising the input word, the greater the time necessary for the DAC to accurately translate the word into a stable $V_{DAC}$ value 98.

Because a new timing edge of incoming waveform 80 cannot enter until some finite time (i.e. the greater of $\tau_{reset}$ and $\tau_{DAC}$) after the ramp time reaches the maximum delay range, delay generators such as that of FIG. 2a cannot be operated with a delay range that spans minimum reprogram time without using multiples of such delay circuits in parallel. Such an arrangement greatly increases system complexity. Further, because $\tau_{DAC}$ is typically greater than $\tau_{reset}$, DAC 92 must be very fast and very accurate for a ramp delay generator to achieve high speed performance with reasonable accuracy.

There is a need in the art for delay generators which have higher programming rates and where the programmable delay range equals or exceeds the minimum reprogram time. For example, in the area of data communications, the higher the frequency of the periodic or carrier waveform, the more digital information can be transmitted per unit time. The delay generator, however, must be capable of being programmed at a rate which is substantially equal to or greater than the higher frequency carrier. In another example, test applications may require timing edges to be delayed beyond the desired minimum reprogram time.

Other delay generator performance criteria of interest include the setability (i.e. how finely the delays may be programmed) and accuracy of the resulting delays. Accuracy can be improved if the system has the ability to be calibrated externally. To achieve higher programming rates, prior art delay generators such as the one in FIG. 2a have employed expensive high-speed DAC's capable of maintaining reasonable resolution, linearity and accuracy over the desired delay range, while converting larger binary words into a greater number of threshold voltages. High speed, high resolution DAC's, however, can be costly.

Another technique used in the past to increase programming rates of prior art delay generators is to employ a number of delay generators in parallel as conceptually illustrated in FIG. 3a. This technique is also costly as a result of circuit complexity. Further, this technique is limited by the speed at which the decoding process takes place.

Finally, an attempt has been made to create a desired delay range over a serial delay line as illustrated in FIG. 3b. The delay line is made up of a series of cells 70, each of which has a fixed maximum delay 72 interposed in one of two paths, and a fixed minimum delay 74 interposed in a second path. Each cell includes a 2:1 multiplexer 76 to choose between the two paths through the cell. A digital control input 71 is provided to control the MUX, and each cell's control input is coupled to one of the bits of a digital control word D(k) 73. The fixed maximum delay of each cell is weighted in accordance with the binary weight of its control bit such that each cell provides its weighted fraction of the total desired maximum delay of the delay line.

There are a number of problems associated with this implementation. First, the delay range of the line is fixed and cannot be changed externally in real time. Second, external calibration of the line is not possible. Third, this implementation of a serial delay line cannot be configured to permit reprogramming times less than the established delay range. Finally, glitches can result from improper timing between signals on the control input and the incoming timing edges, thus interfering with the integrity of the incoming waveform as it propagates through the line. An example of such a serial delay line is sold by Motorola, Inc., known as the 10E195. A more detailed description of this product can be found in the Motorola Eclipse Data Book.

SUMMARY OF THE INVENTION

The method and apparatus of the present invention imposes a digitally programmable delay onto each timing edge of an incoming waveform at a significantly faster programming rate than is currently achievable through prior art programmable delay generators. The present invention achieves its higher programming rate by distributing the total programmable delay for each timing edge of the incoming waveform over a plurality of delay cells which are connected in series. Each delay cell in the series produces some portion of the total delay, which is accumulated as the timing edge propagates through the series.

In the preferred embodiment of the invention, each cell is designed to produce one of only two possible delay states in response to the binary value of a single programming bit. When the program bit is a binary one, each timing edge of an incoming waveform will propagate through the delay cell with a maximum delay of $\tau_{maxC}$. When the program bit is a binary zero, each timing edge of an incoming waveform will propagate through the delay cell with a minimum delay of $\tau_{minC}$. Thus each delay cell is capable of delaying an incoming timing edge with a net programmable delay $\tau_{netC}$ equal to $\tau_{maxC} - \tau_{minC}$. The delay line of the present invention is superior to any previously implemented series delay line because $\tau_{netC}$ for each delay cell is independently tunable over a certain range by an analog calibration input.

In the preferred embodiment of the present invention, each delay cell operates analogously to the ramp delay generator of FIG. 2a. As the delay cells are connected in series, they can be thought of as each representing a fraction of the total ramp of the ramp delay generator of FIG. 2a. The cell of the present invention has a differential input with a slew rate dv/dt that emulates a fraction of the total ramp. Stated differently, the ramp has been distributed over a series of much smaller ramps. Further, N-bit DAC 92 of FIG. 2a has also been distributed as a series of smaller one-bit DACs. Thus, each cell has to convert only one bit into two possible analog threshold voltages.

In the simplest implementation of the delay line of the present invention, each bit comprising the programming word which represents the total desired delay for a specific timing edge is coupled to the programming input of one or more delay cells of the present invention. The one or more delay cells for each bit is called a cluster. Each of the cells forming a cluster are connected in series with one another, and in series with other clusters of one or more cells dedicated to the other bits of the programming word; each cluster accumulates a binary weighted portion of the maximum potential delay through the series in accordance with the binary weight of its control bit.

Thus, the cluster of delay cells which is programmed by the most significant bit (MSB) of the programming word should provide roughly one-half of the maximum net delay through the series when the MSB is a binary one, with the cluster under control of the next most significant bit providing roughly one quarter and so on.

The appropriate portion of the delay produced by each cluster of delay cells can be accomplished by either adjusting the analog calibration input to appropriately tune the net delay for each cell of the cluster, or by fixing $\tau_{netC}$ for each cell of the cluster and then including enough cells in the cluster to produce the appropriate delay. The delay line can also be programmed as a combination of the two techniques.

Thus, rather than producing a range of delays by converting the complete programming word into one of several threshold voltages with a single DAC, the present invention distributes the DAC settling time $\tau_{DAC}$ over a plurality of delay cells each having a single-bit DAC. Thus, each cell must settle on one of only two threshold voltages. Because these one-bit DAC's settle in parallel, the minimum retrigger time required for the series of delay cells is equal to the delay range of the entire delay line (i.e. the sum of all of the $\tau_{maxC}$'s of the series plus the one-bit DAC settling time of a single cell ($\tau_{dac1}$). Because the DAC settling time $\tau_{dac1}$ of a single cell is a fraction of the settling time of the multi-bit DAC employed in prior art ramp delay generators, the reprogramming rate of the present invention is significantly greater.

The method and apparatus of the present invention is capable of still greater improvements in programming rate by taking advantage of the fact that the ramp has also been distributed over the series. Those of skill in the art will recognize that due to the series nature of the present invention, bits of the digital programming word representing the magnitude of the delay to be imposed on a particular timing edge do not have to arrive at the programming inputs of later cells in the series until just before their associated timing edge propagates to the input of those later cells. In the same way, bits of the programming word which are connected to the earlier delay cells of the series do not have to be maintained at the programming inputs of those cells once their associated timing edge has propagated through those earlier cells.

Thus, it can be seen that more than one timing edge of the incoming waveform and their appropriate programming words can occupy the delay generator of the present invention concurrently. Due to the asynchronous nature of a timing edge's propagation through the series as the magnitude of the delays for the individual cells change, however, the method and apparatus of the present invention employs a unique self-clocking feature to permit the pipelining process.

Pipelining the timing edges of the incoming waveform can be accomplished by segmenting the delay cells in a manner which insures that no two timing edges can occupy the same segment of cells concurrently, and by self-clocking the programming data with its associated timing edge to advance the data to the next segment just in time to meet the settling time of the cells in that next segment. Those of skill in the art will recognize that the programming information must be self-clocked by its associated timing edge as it moves through the series because the timing edges will not appear at the inputs of succeeding segments synchronously. Pipelining the delay generating process further increases the reprogramming rate because the minimum retrigger time is now constrained only by the maximum delay through a segment of the series plus the set-up and hold time for the timing edges entering and exiting the segment. It would be difficult if not impossible to pipeline the prior art serial delay line as previously described.

It is therefore an objective of the present invention to substantially increase the reprogramming rate of a digital delay generator without substantial increase in cost.

It is a further objective of the present invention to increase the reprogramming rate by distributing the settling time of multiple bit DACs used in conventional delay generators over a series of delay cells having a fast-settling single-bit DAC.

It is still further an objective of the present invention to increase the reprogramming rate by permitting the pipelining of timing edges through the series, using the timing edges to self-time the advance of the programming information.

It is still further an objective of the present invention to provide a delay cell design which is simple to construct in any semiconductor technology and which can be calibrated with any easily accessible analog input voltage to eliminate offsets and other causes of inaccuracies and to permit real time programming of the net delay through each cell.

These and other features of the preferred embodiment of the present invention are presented in more detail in the following detailed description of the preferred embodiment.

BRIEF DESCRIPTION OF THE DRAWINGS

FIG. 2b compares input and output waveforms of the ramp delay generator of FIG. 2a.

FIG. 4a is a block diagram representation of the series delay generator of the present invention.

FIG. 4b is a generic delay cell for implementing the series delay generator of the present invention.

FIG. 7b is a typical output from the delay cell of FIG. 7a.

FIG. 8b is a typical output from the delay cell of FIG. 8a.

DETAILED DESCRIPTION OF THE INVENTION

1. The Delay Line

The method and the apparatus of the present invention imposes a digitally programmable delay on the timing edges of an incoming waveform. The instant invention departs from the prior art in that it essentially distributes the digital-to-analog conversion process and the ramp generation process of known ramp delay generator circuits over a series of tunable delay cells each providing a fraction of the total programmable delay range desired.

A conceptual illustration of the distributed delay generator of the present invention is shown in FIG. 4a. Delay generator 32 is made up of N delay cells 30 connected in series with one another such that the total delay $\tau$ imposed on a particular timing edge of V(t) is accumulated as it propagates through the series; the total delay $\tau$ through the delay line equals the summation of $\tau_i$ for each of the cells 30 from i=1 to n. The first cell of the series, dCell1, receives v(t) as its input and outputs $V(t+\tau_1)$. The next cell, dCell2, receives $V(t+\tau_1)$ as its input and outputs $V(t+\tau_1+\tau_2)$, and so on. The binary bits of an N-bit digital programming word D(k) are appropriately coupled to the inputs $D_i$ of the cells 30 to control the overall delay $\tau$ of the delay line. The analog tuning input Ai for each cell 30 is coupled to a source of variable reference voltages 42 to produce the desired $\tau_{netCi}$ for each cell 30.

FIG. 4b provides a block level illustration of an individual delay cell dCell(i) 30. In the preferred embodiment of the invention, each dCell(i) 30 is capable of delaying a timing edge received on its input IN 34 by either $\tau_i = \tau_{maxCi}$ when a binary one is present on its control input Di 38, or $\tau_{minCi}$ when a binary zero is present on Di. $\tau_{minCi}$ is the minimum delay through dCell(i) due to circuit path propagation delays; $\tau_{maxci}$ is the maximum delay through dCell(i) 30. The programmable net delay of dCelli 30 is $\tau_{netCi} = \tau_{maxCi} - \tau_{minCi}$, the magnitude of which is tunable via analog input voltage Ji 36. Thus, each cell must accurately convert to one of only two threshold values rather than $2^N$ threshold values as does the prior art ramp delay generator. A more detailed description of a preferred embodiment of dCell(i) 30 will be presented below.

Figure 1A:
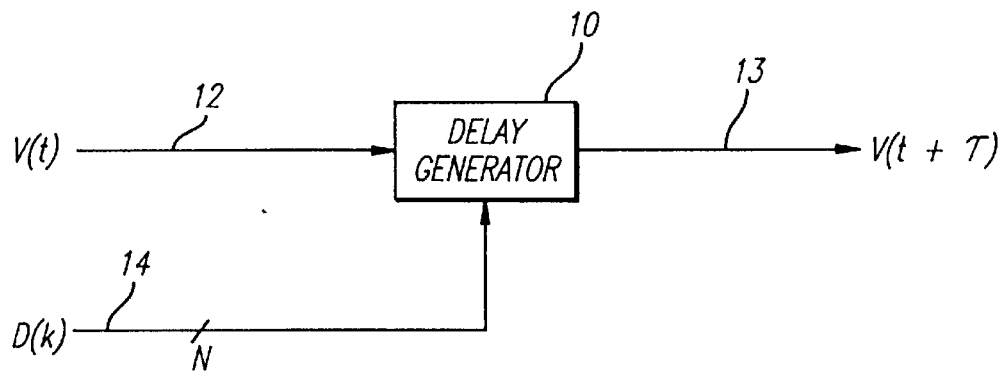
FIG. 1a is an illustration of a generic prior art delay generator.
Figure 1B:
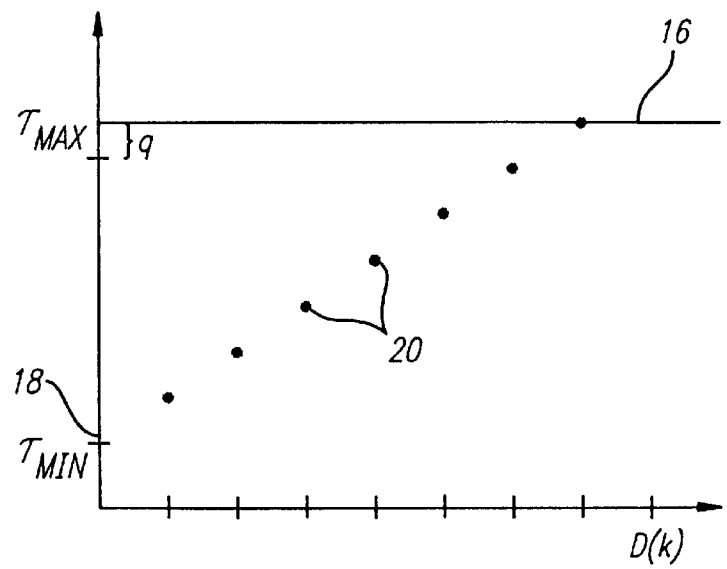
FIG. 1b is graph of the output characteristic of a generic prior art delay generator.
Figure 1C:
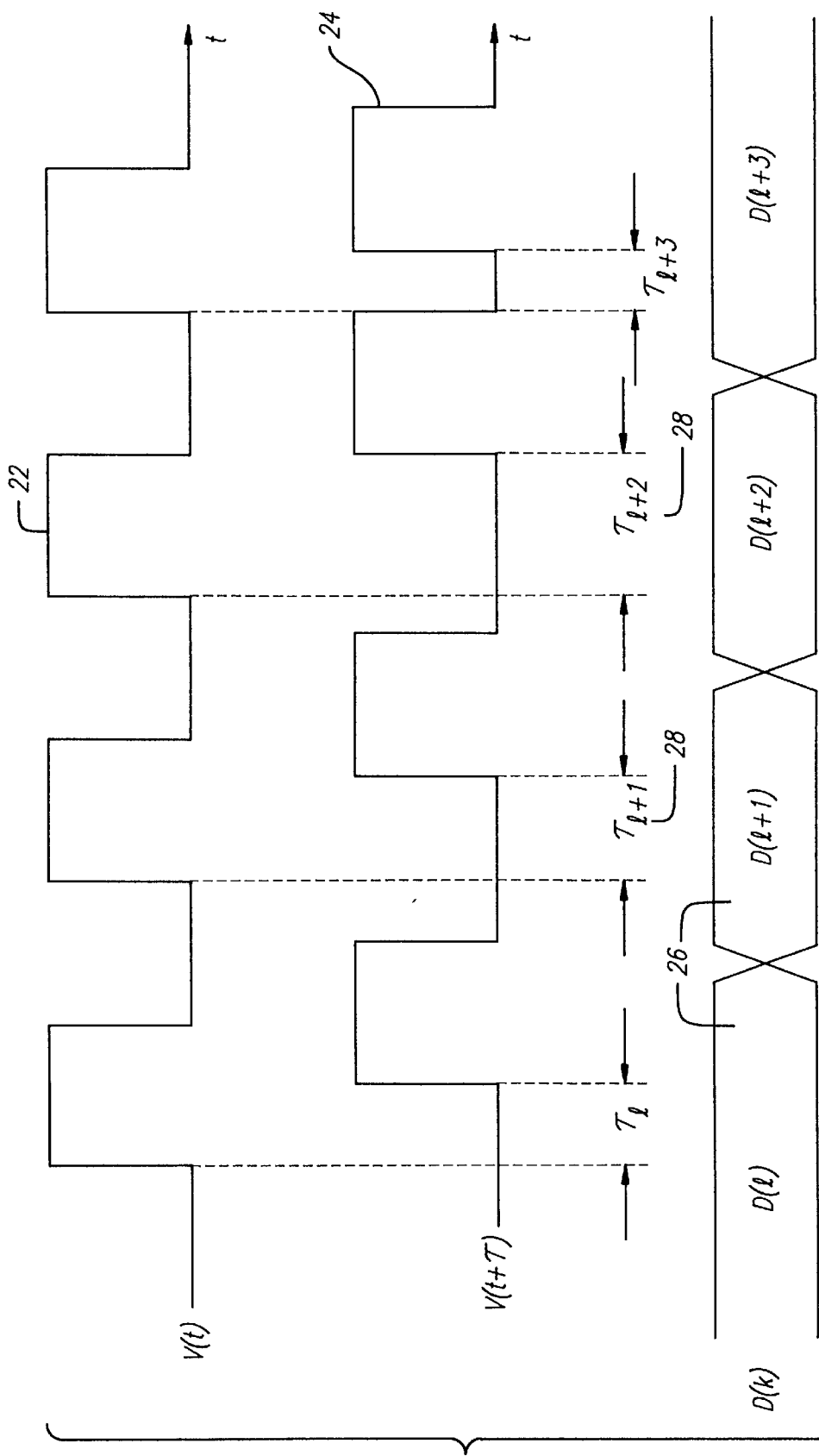
FIG. 1c compares input and output waveforms for a prior art delay generator.
Figure 2A:
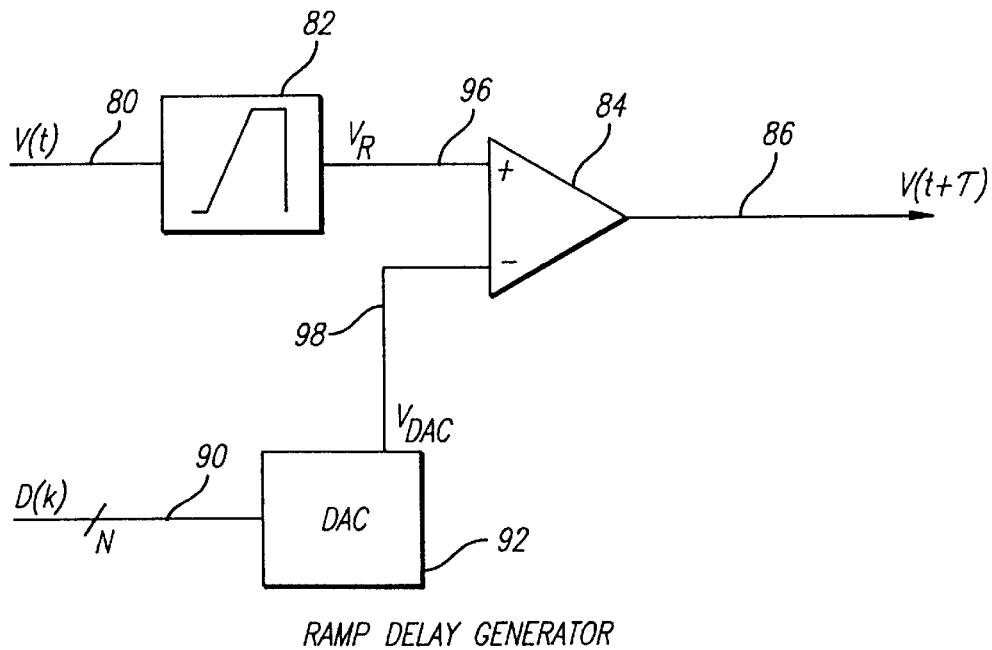
FIG. 2a is a block diagram of a prior art ramp delay generator.
Figure 3A:
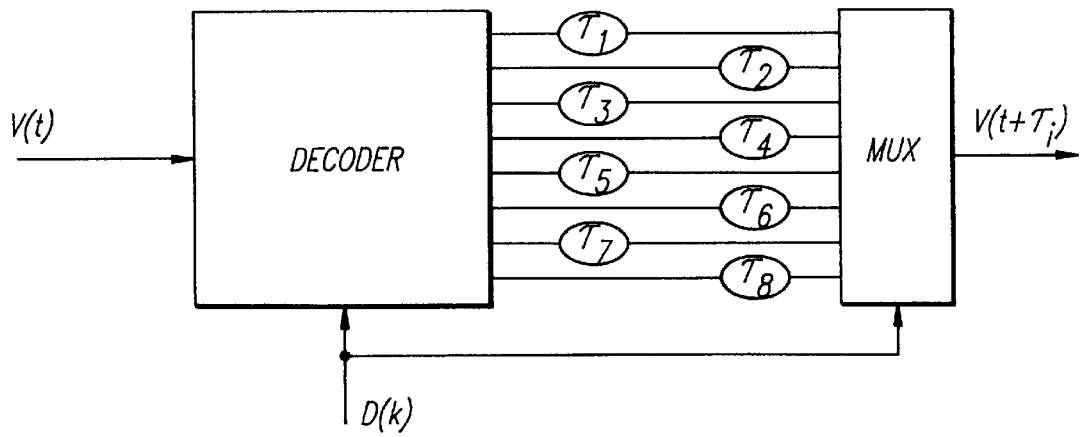
FIG. 3a is an example of a generic prior art parallel delay generator.
Figure 3B:
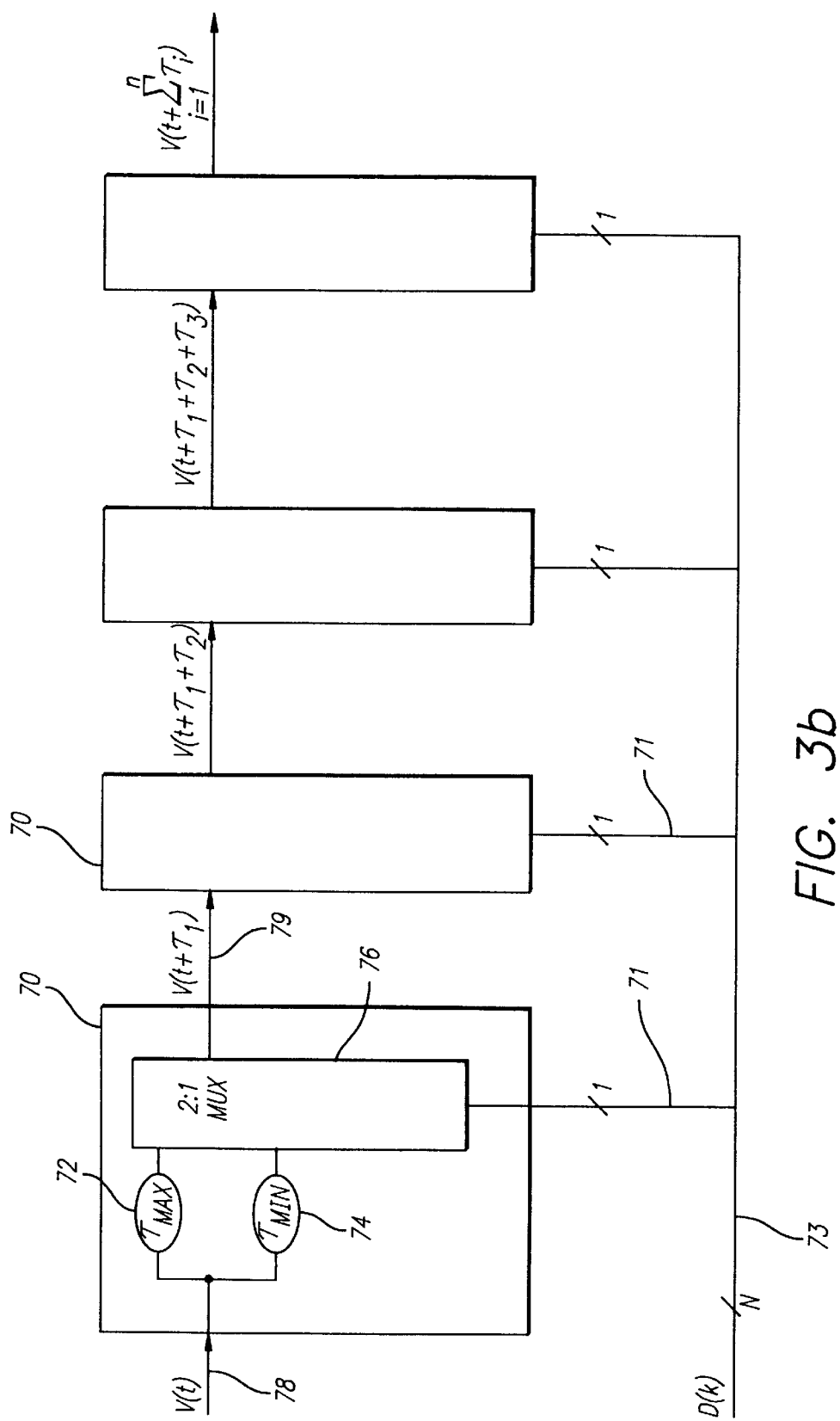
FIG. 3b is an example of a prior art serial delay generator.
Figure 4C:
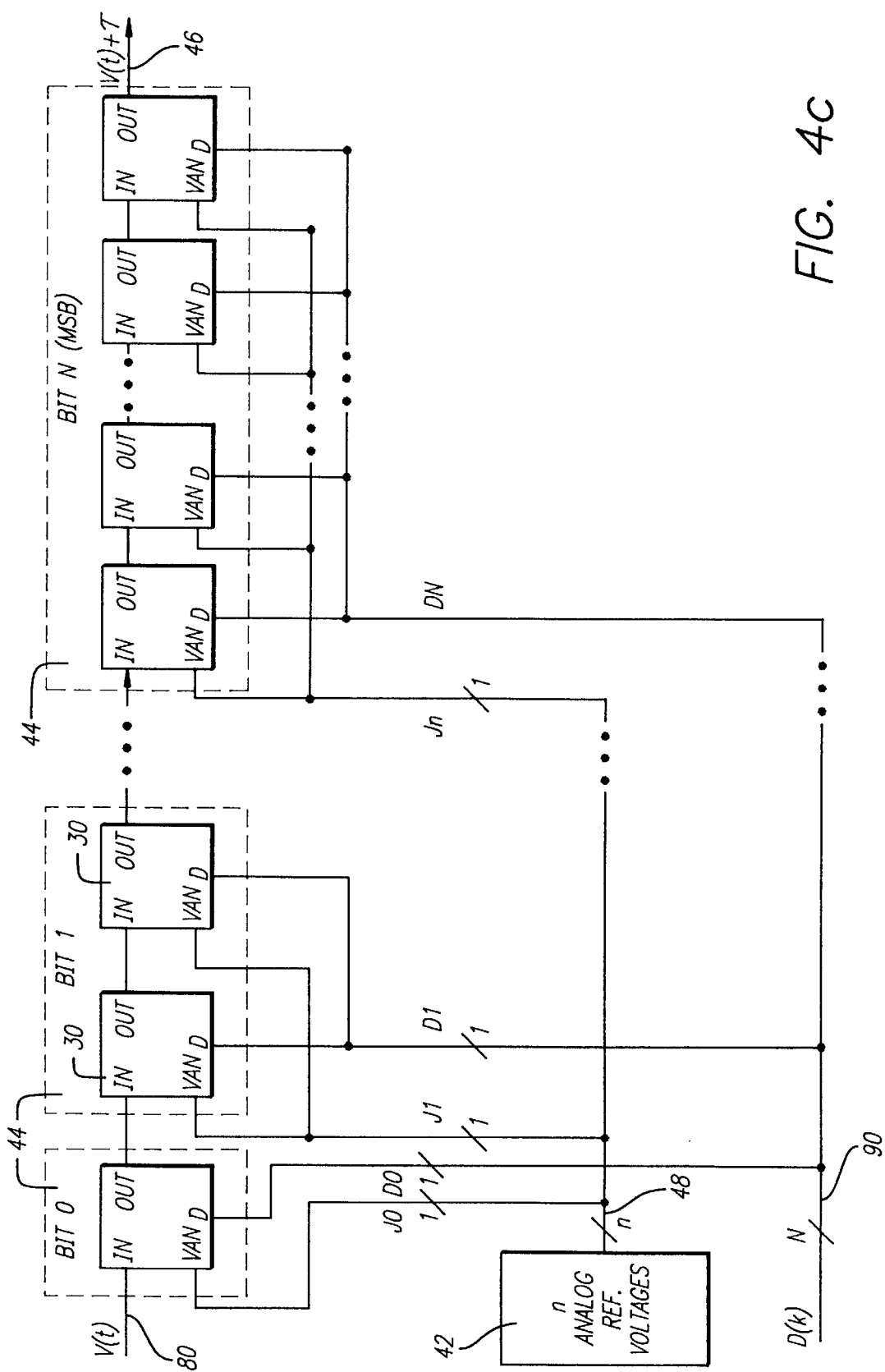
FIG. 4c is an implementation of the series delay generator of the present invention.

FIG. 4c illustrates a general implementation wherein a certain number of cells comprising a cluster 44 are assigned to each bit N of the digital word D(k). Each cell 30 of a cluster 44 assigned to a particular bit N receives that bit as an input to its control input D. Circuit block 42 represents circuitry for generating analog reference voltages which are coupled to the VAN (analog voltage) inputs of each cell 30 in the series. The net delay under the control of each bit N can be made proportional to its binary weight through the total number of delay cells under its control and/or the value of the analog reference voltages input to those cells.

Figure 5A:
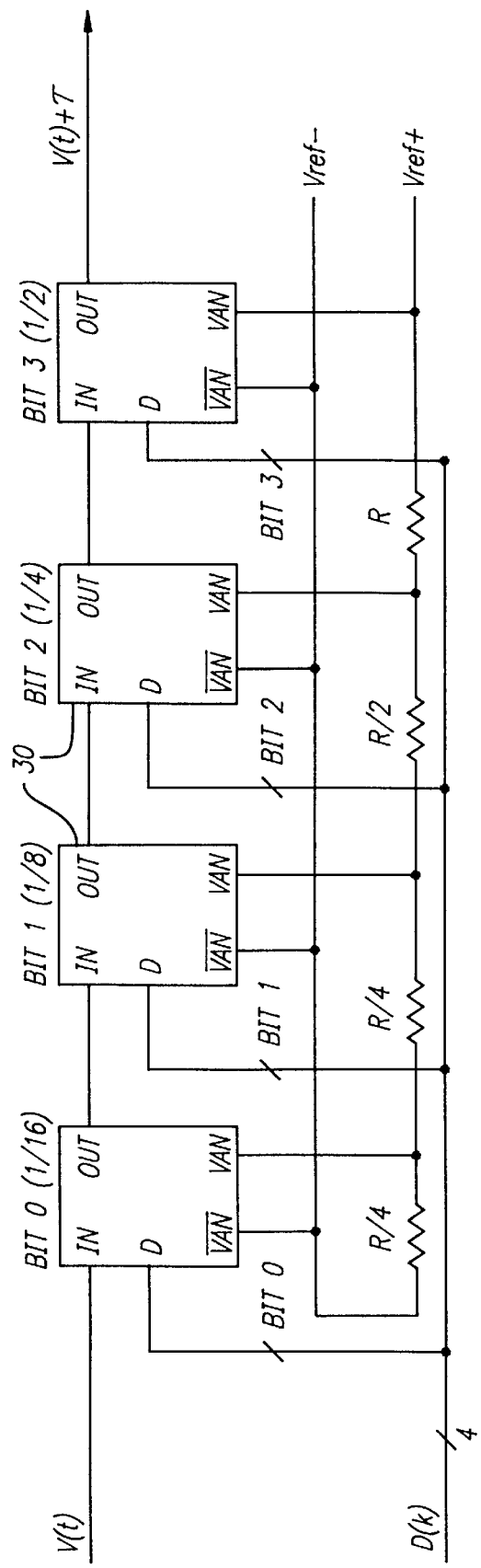
FIG. 5a is an implementation of the series delay generator of the present invention using single cells for each bit of a programming word.
Figures 1, 5B:
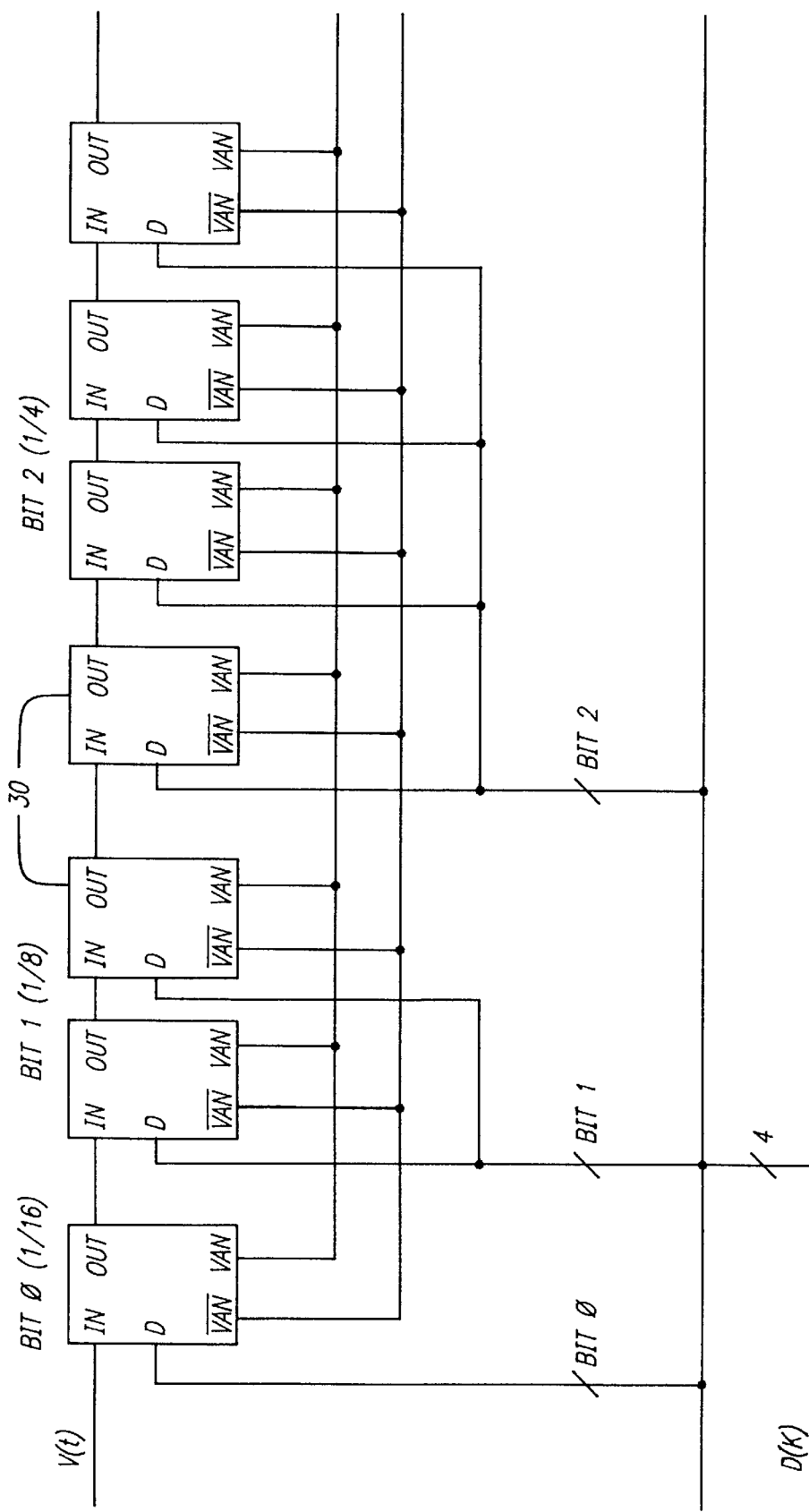
FIG. 5b is an implementation of the series delay generator of the present invention using multiple cells for each bit of a programming word.
Figures 2, 5B:
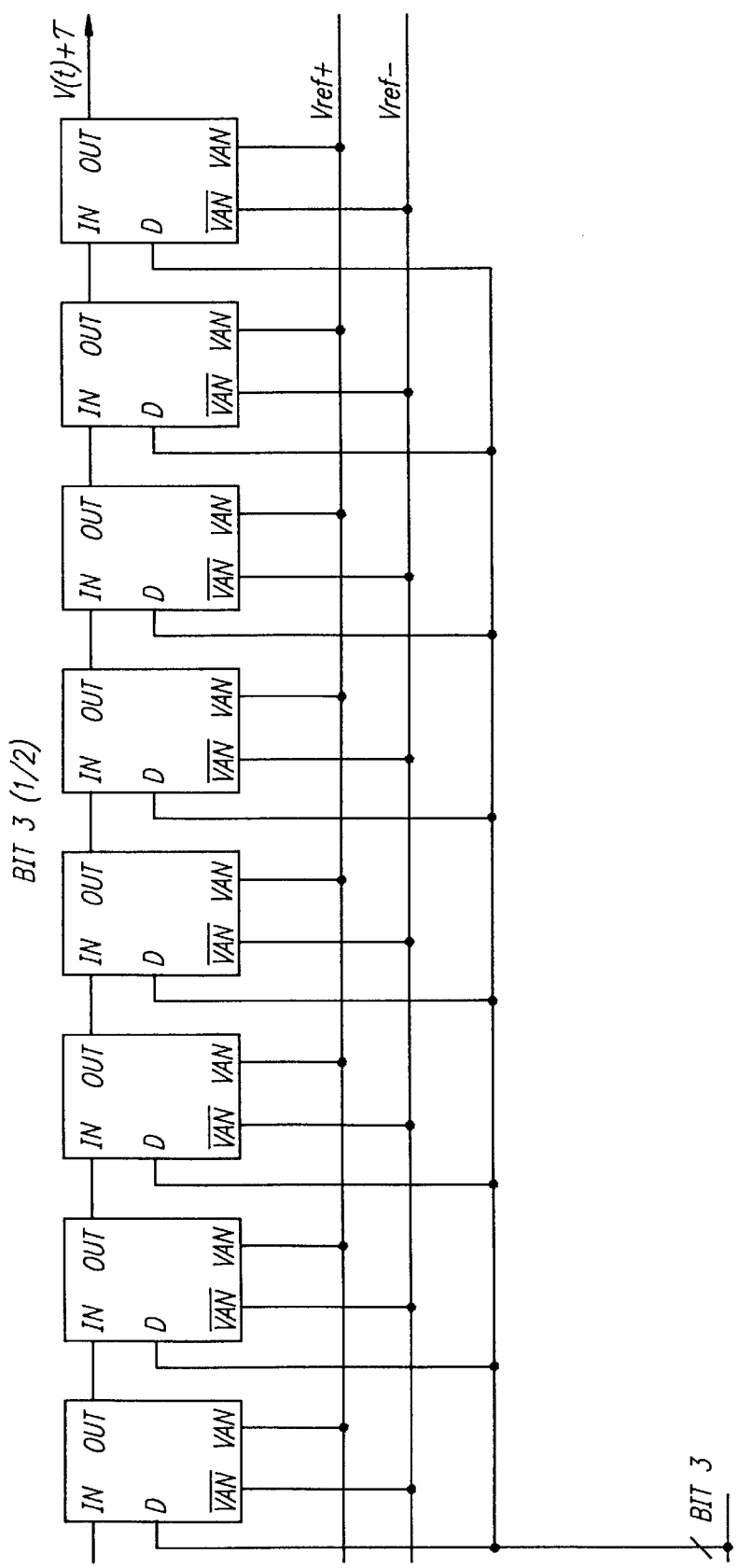

FIGS. 5a and 5b illustrate embodiments of the present invention, both of which employ only one of the two ways of programming delay for each bit of the programming word D(k). FIG. 5a employs only one delay cell 30 for each binary bit N of program word D(K); each bit of the program word controls the D input of only one delay cell. $\tau_{netC}$ is established for each cell 30 using the analog input VAN such that the most significant bit (MSB) of the program word D(k) provides about one-half of the total net delay of the delay line. Each of the remaining bits provides a fraction of the desired maximum $\tau_{netL}$ through the entire delay line which is commensurate with its binary weight. The configuration of FIG. 5a employs a ladder circuit in lieu of reference voltage circuit 42, which is similar to those used in certain types of digital to analog converters (DACs) to establish the appropriate reference voltages. Those of skill in the art will recognize that there are many equivalent ways of establishing the appropriate reference voltages.

The implementation of FIG. 5b uses the same reference voltage for each of the cells 30 in the series. Thus, each cell is programmed to provide the same net delay $\tau_{netC}$. Each bit of the programming word D(k) is coupled to the D inputs of that number of cells which will in sum provide that fraction of the total maximum net delay of the delay line ($\tau_{netL}$) that is commensurate with the binary weight of the bit. Those of skill in the art will recognize that a combination of the two implementations can be employed to optimize simplicity and performance. Those of skill in the art will also recognize that calibration of each cluster 44 can be achieved by tuning one of the cells in the cluster by adjusting the magnitude of the voltage on its analog input.

Those of skill in the art will recognize that the analog voltage may be referenced to ground, or the analog voltage can be the difference between two analog inputs such as VAN positive and VAN negative.

The implementations illustrated in FIGS. 5a and 5b provide improved reprogramming rates over the prior art Ramp Delay Generator because the DAC settling time ($\tau_{DAC}$) has been distributed over the series. Thus, rather than decoding four bits to settle on one of sixteen values, the individual delay cells 30 are only required to decode one bit to settle on one of only two values. Further, the one-bit DACs of the individual cells all settle in parallel. Thus, the maximum reprogramming rate of the delay line of the present invention will equal the maximum delay of the delay line $\tau_{maxL}$ (i.e. the delay when all of the cells are programmed to produce a delay of $\tau_{maxC}$) plus the settling time of the one-bit DAC (i.e. $\tau_{dac1}$).

Still further increases in the maximum reprogramming rate can be achieved by exploiting the serial nature of the delay line of the present invention. Each cell of the delay line can be made to effectively generate a fraction of the ramp of the prior art ramp delay generator through the slew rate of an input differential pair; the ramp therefore can be segmented so that more than one timing edge can occupy the delay line at the same time. The delay process can be pipelined because each cell can be reprogrammed after spanning only a fraction of the programmable range of the entire delay line. Thus, the reprogramming rate can be equal to or less than the delay range of the entire delay line.

The delay line of the present invention can be pipelined by dividing its cells into segments and permitting only one timing edge to occupy a segment of cells at any one time. Each segment is provided with that portion of the programming word, associated with the edge about to enter it, necessary to control the cells of that segment. The reprogramming rate can therefore be increased by a multiplicative factor approximately equal to the number of edges that can occupy the delay line at the same time.

Certain timing constraints have to be met which govern the minimum permissible delay per segment, and thus the maximum number of segments per delay line. The use of pipelining and the requisite timing constraints are explained in association with the implementations shown in FIGS. 6a and 6b.

Figure 6A:
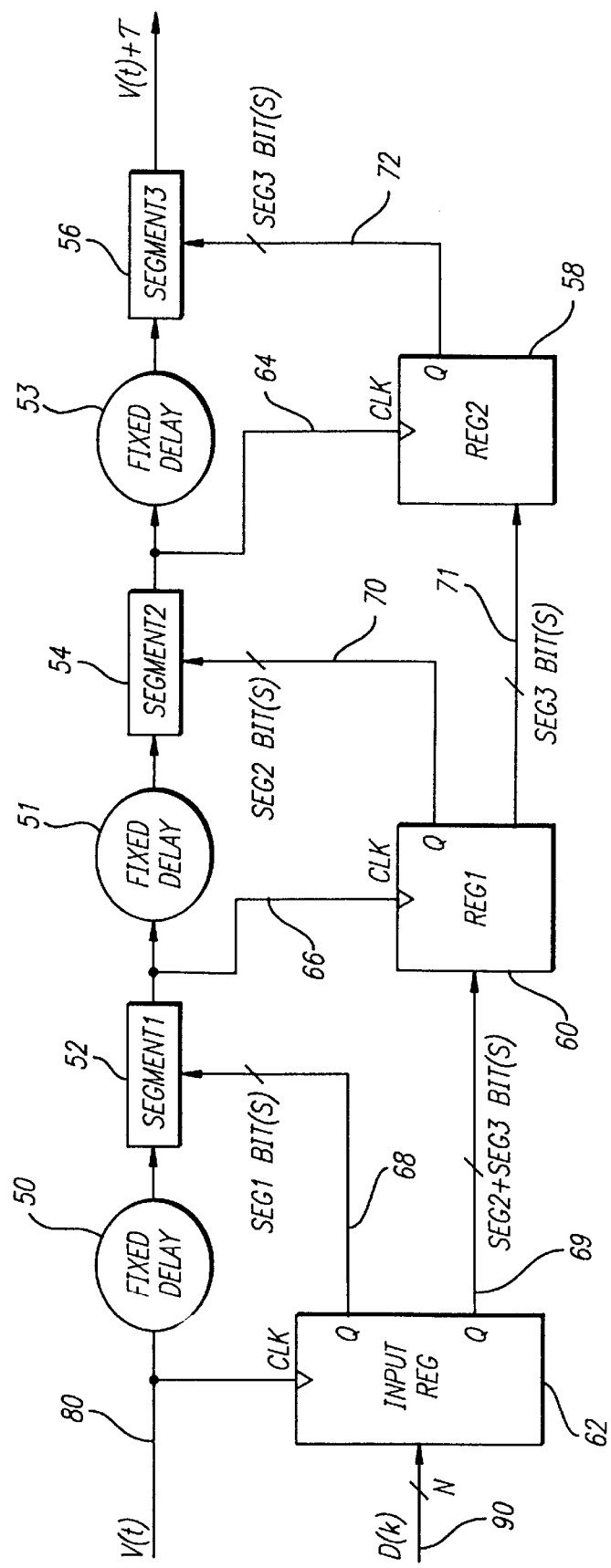
FIG. 6a is a pipelined implementation of the series delay generator of the present invention.
Figure 6B:
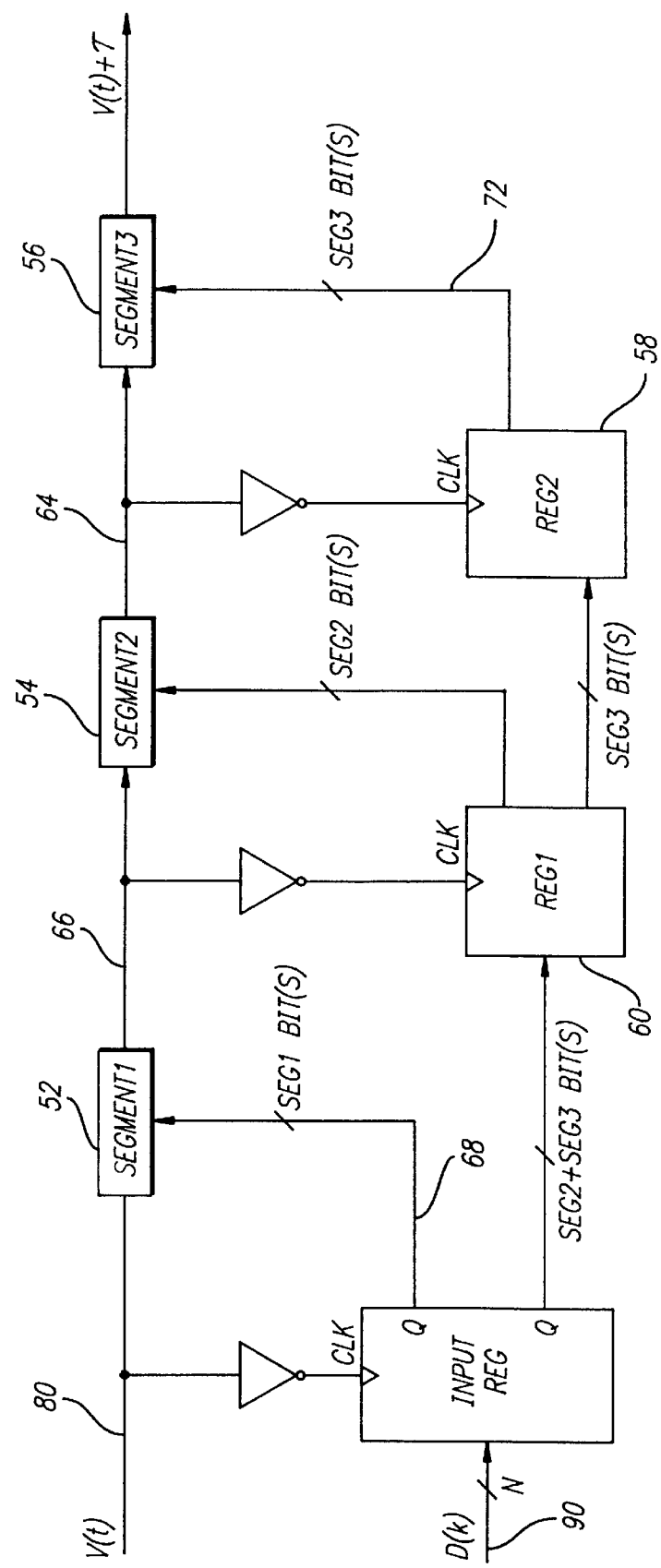
FIG. 6b is a pipelined implementation of the series delay generator of the present invention using the non-timing edge of the incoming waveform to advance the programming information.

FIG. 6a illustrates a delay line of the present invention that has been apportioned into three segments 52, 54 and 56 of delay cells. Each of the segments comprises one or more delay cells and each segment preferably provides an approximately equal fraction of the total maximum delay of the delay line. The delay line illustrated in FIG. 5b could be so apportioned, and each of its segments would comprise five of its delay cells 30. Each segment is provided with those bits of D(k) necessary to program the cells comprising that particular segment.

Assuming that the delay line shown in FIG. 6a is a pipelined implementation of the delay line shown in FIG. 5b, Segment1 52 can comprise the cells 30 which are programmed by Bits 0 and 1 and two of the cells programmed by Bit 2. Segment2 54 can include the remaining two cells programmed by Bit 2, as well as three of the cells programmed by Bit 3. Segment3 56 would comprise the remaining five cells programmed by Bit 3.

In the example of FIG. 5a, D(k) 90 is a 4-bit word and the Q output 68 of Input REG 62 will include Bits 0, 1 and 2. The Q output 69 of Input REG 62 will include Bits 2 and 3. The Q output 70 of REG1 60 will include Bits 2 and 3 and the Q output 71 of REG1, as well as the Q output of REG2 72, will include Bit 3. It will be recognized by one of skill in the art that it is preferable to order the series starting with the cells coupled to the least significant bits because the number of bits of programming word D(k) 90 that must be passed on to succeeding segments will decrease and thereby reduce the requisite number of registers.

The implementation of FIG. 6a illustrates the asynchronous nature of the delay line. The time required for timing edges to propagate through a particular segment will vary in accordance with the programmable word associated with each timing edge, as well as the magnitude of the analog voltage present on the VAN inputs to the cells. Thus, the timing edges themselves must be used to advance their associated program word information to the next segment as they emerge from the outputs of the segments they currently occupy.

Because there is delay associated with the clocking of programming information from the input to the output of the registers 62, 60 and 58, and because the delay cells of a segment must have sufficient time (i.e. $\tau_{dac1}$) to settle in response to the presence of new data on their D inputs, the timing edge must be delayed from entering the next segment until the delay cells of the next segment have been reprogrammed. Fixed Delay elements 50, 51 and 53 are interposed between the output of a segment and the input of the next segment to delay the timing edges by a time equal to or greater than the Clock-to-Q times of the registers 62, 60 and 58, and the $\tau_{dac1}$ of the cells in the delay line. Those of skill in the art will recognize that there are many ways of achieving the Fixed Delays 50, 51 and 53, including tapping off of delay cells occurring earlier in the delay line to provide this function.

The timing constraints derive from the fact that two timing edges cannot be present simultaneously within the same segment. Thus, a timing edge cannot be permitted to enter a segment too early, i.e. before a timing edge currently occupying that segment leaves the segment or, before the segment has had the chance to be programmed. Thus, the minimum time between timing edges at the input of a particular segment i ($T_{period,\ i(min)}$), must be greater than $T_{maxSi}+T_{iProgram}$, where $T_{maxSi}$=the maximum delay period through the segment i and $T_{iProgram}$=the programming time of the segment. $T_{iProgram}$ equals the clock-to-Q time $\tau_{ff}$ of the register supplying the programming information to the ith segment (e.g. Input REG 62, REG1 60 or REG2 58, FIG. 6a) plus the worst case DAC settling time of one of the cells in the segment, $\tau_{dac1}$. Stated differently, as long as the time between timing edges at the input of a segment is never less than the time required to traverse that segment and its fixed delay, the system will operate properly and the maximum reprogramming rate for the delay line will equal $1/\tau_{maxSi}+\tau_{ff}+\tau_{dac1}$, where $\tau_{maxSi}$ is the greatest maximum delay through a segment i of the delay line. Thus, for a reprogramming rate of 500 MHz, $\tau_{maxSi}+\tau_{ff}+\tau_{dac1}>2$ nanoseconds.

Because the fixed delays 50, 51 and 53 waste delay cells and contribute to noise in the system, it is desirable to eliminate them if possible. The implementation of FIG. 6b eliminates the fixed delays by using the non-timing edge of the input waveform V(t) 80 to advance the program data for the next timing edge. To meet the requisite timing constraints, a timing edge of V(t) 80 must lead the falling edge (i.e. self-timing edge) at the input of a segment i by a quantity of time equal to $\tau_{maxSi}-\tau_{ff}$, where $\tau_{maxSi}$ is the maximum delay through the segment i and $\tau_{ff}$ is the time it takes for data to propagate through the register supplying program data to that segment (i.e. Clock-to-Q). Further, the falling edge must lead the next timing edge by a quantity $\tau_{ff}+\tau_{dac1}=\tau_{iProgram}$.

Thus, the maximum permissible $\tau_{maxSi}$ for each segment i can be determined once the high ($T_h$) and low ($T_1$) times of V(t) 80 have been fixed; $T_h>T_{maxSi}-T_{ff}$, and $T_1>T_{iProgram}$. It is important to note that the timing issues become more complicated for this implementation because the $T_h$ and $T_l$ times can be affected by the delay line as the waveform propagates through it.

2. The Cell

Those of ordinary skill in the art will recognize that there are many conceivable embodiments of a delay cell that can meet the functional requirements as previously defined for the delay line of the present invention. The choice of a delay cell embodiment will depend on a number of performance factors including the desired maximum speed of the system, the accuracy and setability of the system, the circuit technology in which the delay line will be manufactured, circuit area constraints, etc. Thus, the delay line of the present invention does not depend on the details of any particular delay cell embodiment for its patentability.

Figure 7A:
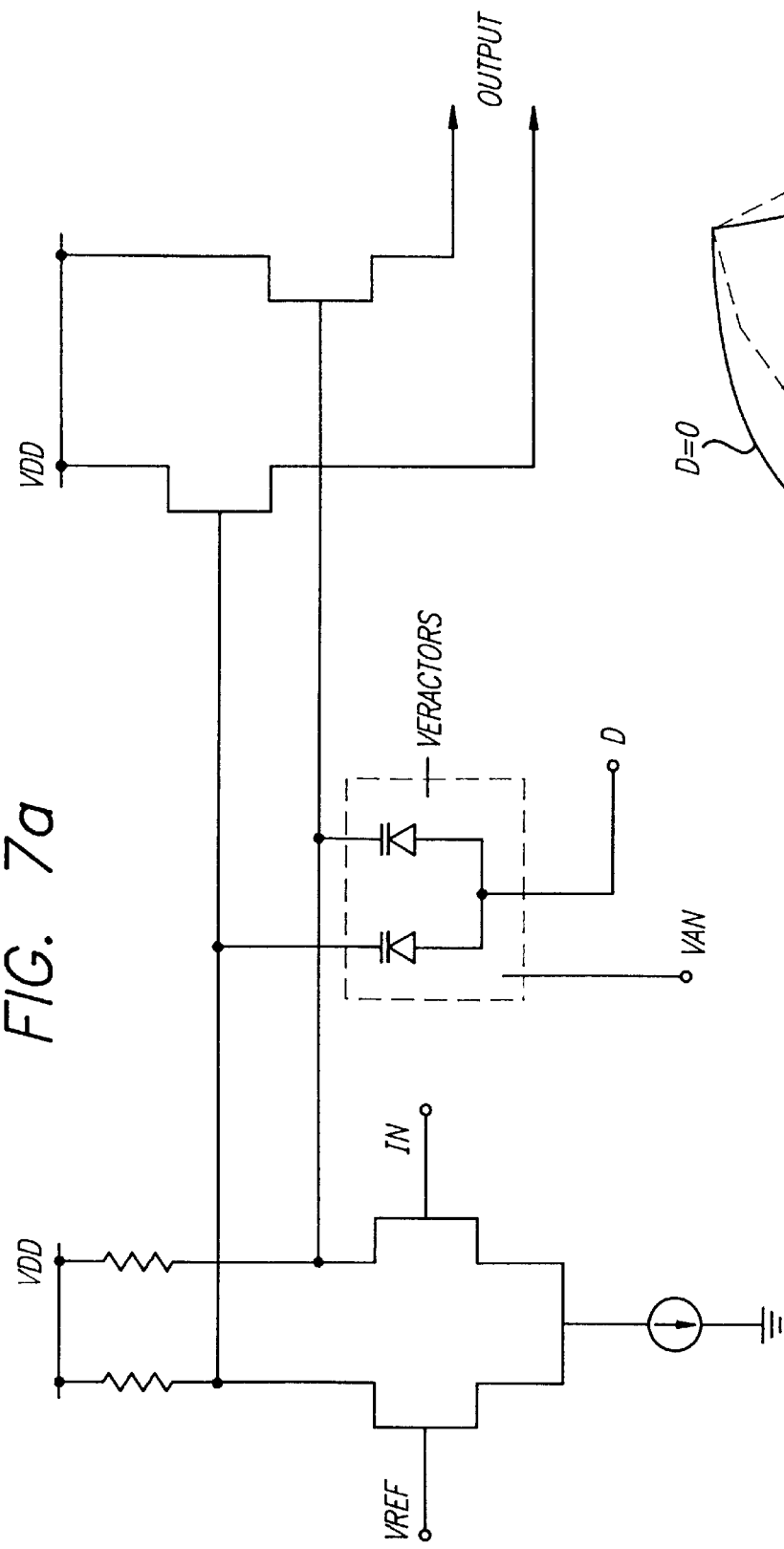
FIG. 7a is a general embodiment of a delay cell that can be used to implement the series delay generator of the present invention, using a veractor.
Figure 7B:
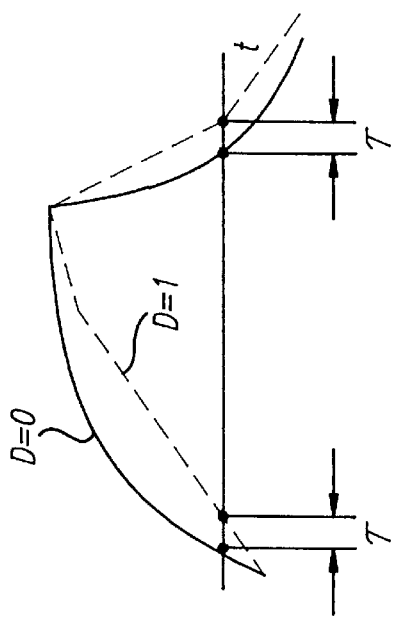

One possible delay cell embodiment is illustrated in FIG. 7a. The core of the delay cell of FIG. 7a is a differential input stage which drives a source-follower stage which drives a capacitive load provided by a varactor. The capacitance of the varactor can be varied as a function of the analog input voltage. As the capacitive load is increased or decreased, the rise and fall times of the output waveform also increase or decrease as illustrated in FIG. 7b. A phase shift of the timing edge is created as a function of the variable time constant of the circuit. Thus, the point at which the output voltage crosses some DC value can be advanced or retarded as a function of the tuning analog voltage to create a $\tau_{maxC}$ for the cell. A digital input can be used to select a path through the varactor when its binary value is a one, and to bypass the varactor when its binary value is a zero.

The advantage of this embodiment is that it does not significantly affect the pulse width of the incoming waveform as the waveform propagates through it. The primary disadvantage is that the capacitive load on the output limits the usable high frequency range.

Figure 8A:
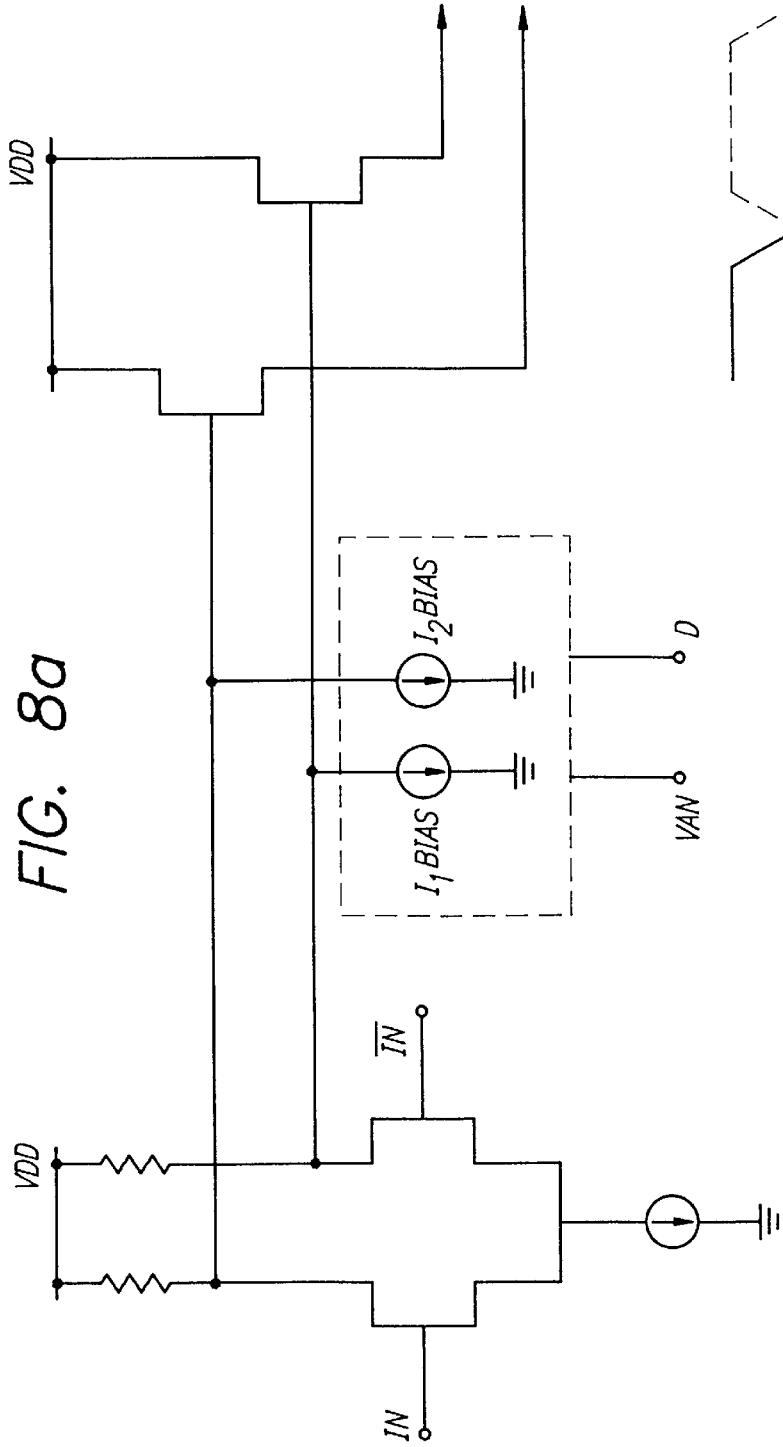
FIG. 8a is a general embodiment of a delay cell that can be used to implement the series delay generator of the present invention.
Figure 8B:
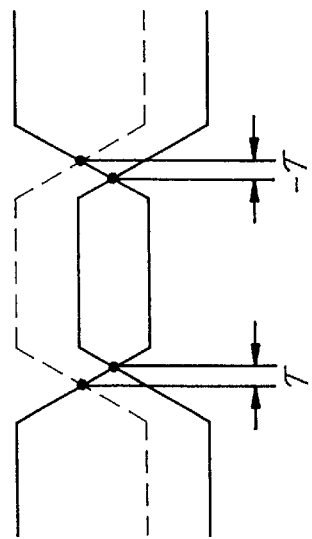

A second possible embodiment of a delay cell is illustrated in FIG. 8a. The core of this cell is a differential input stage the outputs of which drive a source-follower output stage. In this embodiment, variable current sources are connected to the outputs of the differential input stage to impose a DC offset voltage on the waveforms seen at those nodes. Because the waveforms are shifted by DC voltages of opposite polarity, the points at which the wave forms cross will be advanced or retarded in time. Because the differential input of the next stage rejects the DC offset voltages, it outputs waveforms the crossover points of which have been shifted by some time $\tau$ with respect to the waveform that had been input into the previous cell. FIG. 8b illustrates this effect.

The advantage of this embodiment is that the circuit can be operated at high speeds and the DC offsets created by the variable current sources can be tuned using an analog input. The primary disadvantage of this embodiment is that the pulse width of the incoming waveform shrinks when a positive delay $\tau$ is imposed on the timing edge of the waveform because a negative $\tau$ of equal magnitude is imposed on the non-timing or failing edge of the waveform. This is illustrated in FIG. 8b. Thus, as delay is accumulated through a series of such cells, the timing edge can be swallowed if the high-time ($t_h$) of the timing waveform shrinks to zero. Further, the self-timing scheme illustrated in FIG. 6b would be virtually impossible to implement because it relies on a reasonably stable time between the timing edge and the non-timing edge of the waveform so that the non-timing edge of the waveform can be used to reliably self-clock the programming data through the pipelining circuitry of the delay line.

Figure 9:
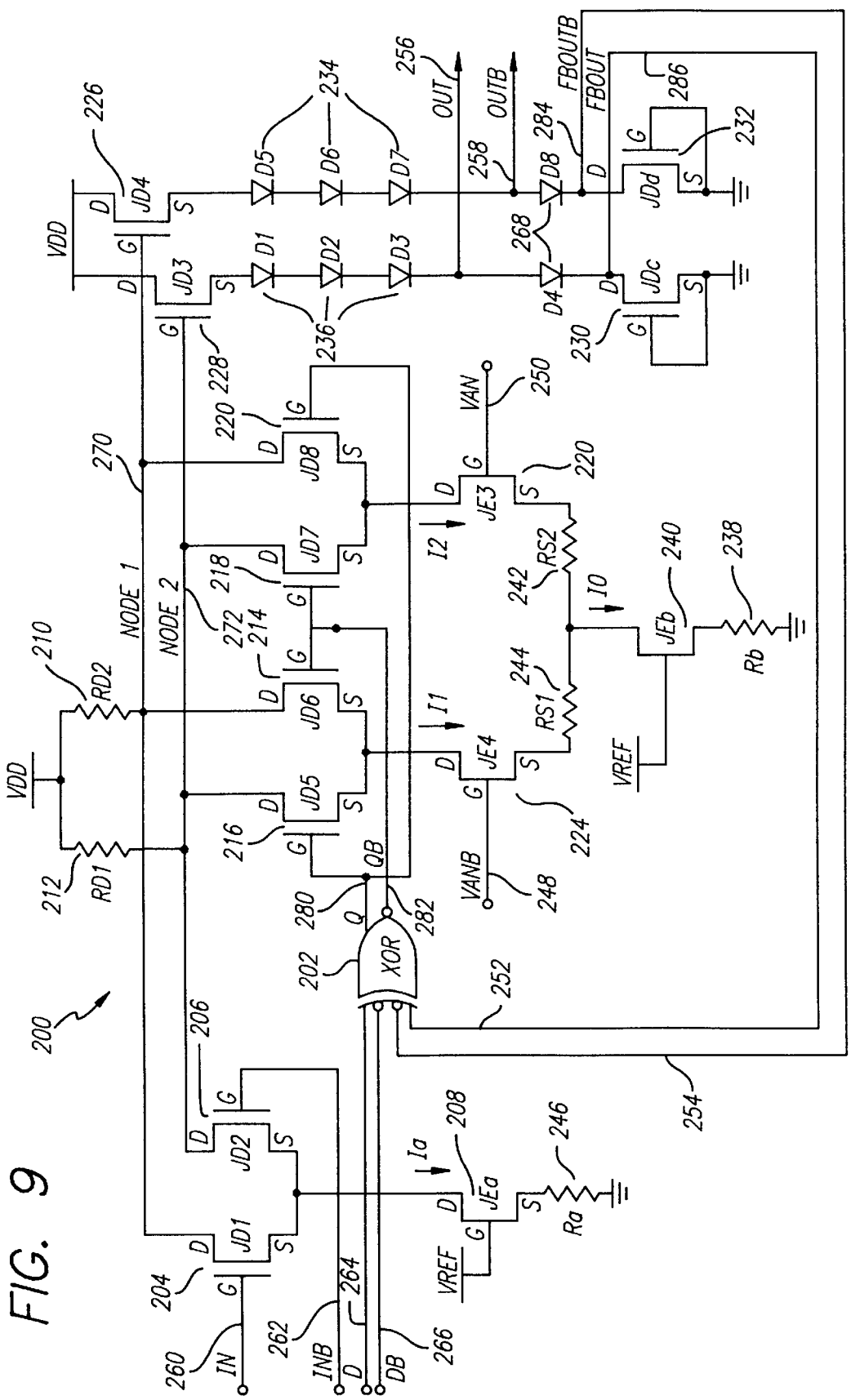
FIG. 9 is a detailed circuit diagram of a delay cell of the present invention that can be used to implement the series delay generator of the present invention.
Figure 10:
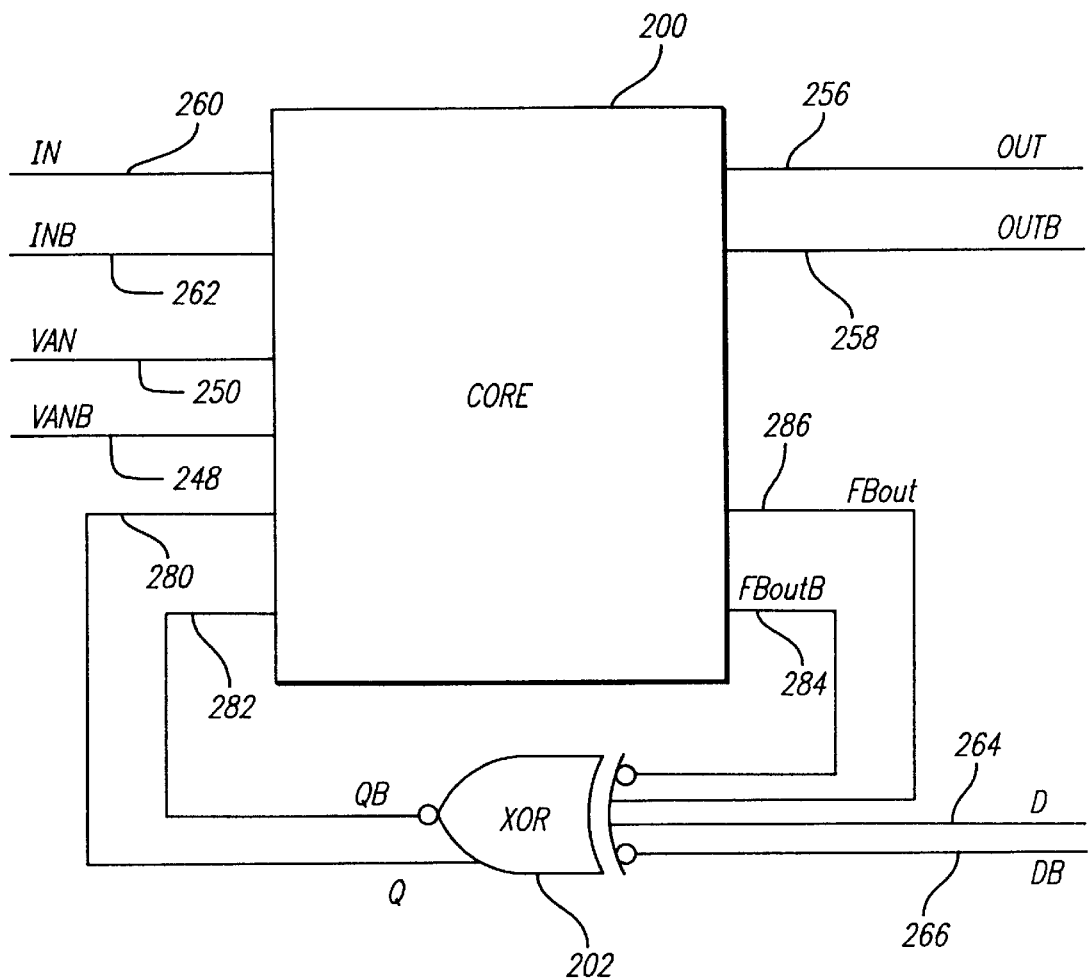
FIG. 10 is a block diagram of the delay cell of FIG. 9.

A first preferred embodiment of a cell for implementing the delay line of the present invention is illustrated in FIGS. 9 and 10. The core 200 of the preferred embodiment of the cell is very similar to the embodiment illustrated in FIG. 8a. The preferred embodiment, however, includes an XOR gate 202 that is used to correct the problem of the shrinking pulse width described in conjunction with the circuit of FIG. 8a. XOR gate 202 is used to invert the delay imposed on the falling edge so that the delay on the falling edge has the same sign as the delay on the rising or timing edge. Thus both of the edges will be either advanced or retarded by the same amount and the pulse width remains roughly the same. The mechanism by which this is accomplished will be described in detail below with reference to FIG. 9, which shows a transistor level schematic of the core 200 of the cell and its connections to the XOR gate 202, and with reference to FIG. 10, which shows a logic level depiction of the core 200 of the cell with its requisite connections to the XOR gate 202.

Depletion mode field effect transistors (FET) JD1 204 and JD2 206 form the differential input pair of the core. The gate of JD1 204, which forms input IN 260, is coupled to an incoming waveform v(t) if the cell is the first cell in the delay line, or is otherwise coupled to the output OUT 256 of a preceding cell. Input INB 262 is coupled to an inverted version of v(t) if the cell is the first in the delay line, or is otherwise coupled to the output OUTB 258 of a preceding cell.

Enhancement mode FET JEa 208 is configured as a current source such that the sum of current ID1 through JD1 204 and ID2 through JD2 206 equals the current Ia through JEa 208. ID1=ID2 when the voltages on IN 260 and INB 262 are equal; this occurs at the crossover points between the signals on IN 260 and INB 262. When the input waveforms cross, the outputs of the differential pair (i.e. NODE1 270 and NODE2 272) will also be at zero voltage. As the input voltages on IN 260 and INB 262 become unequal, ID1 becomes unequal to ID2 and the difference in voltage between the two signals is amplified and reflected in the voltages seen at NODE1 270 and NODE2 272. If the gain of the differential pair is great enough, the outputs will switch much like the output of a comparator. Thus, as the voltage on IN 260 becomes greater than the voltage on INB 262, the voltage on NODE1 270 will slew toward the negative rail of the supply. When the voltage on IN 260 becomes less than that on INB 262, the voltage on NODE1 270 will slew toward the positive rail of the supply. Of course, the voltage on NODE2 272 will slew in a direction opposite to that of the voltage on NODE1 270.

Figure 11:
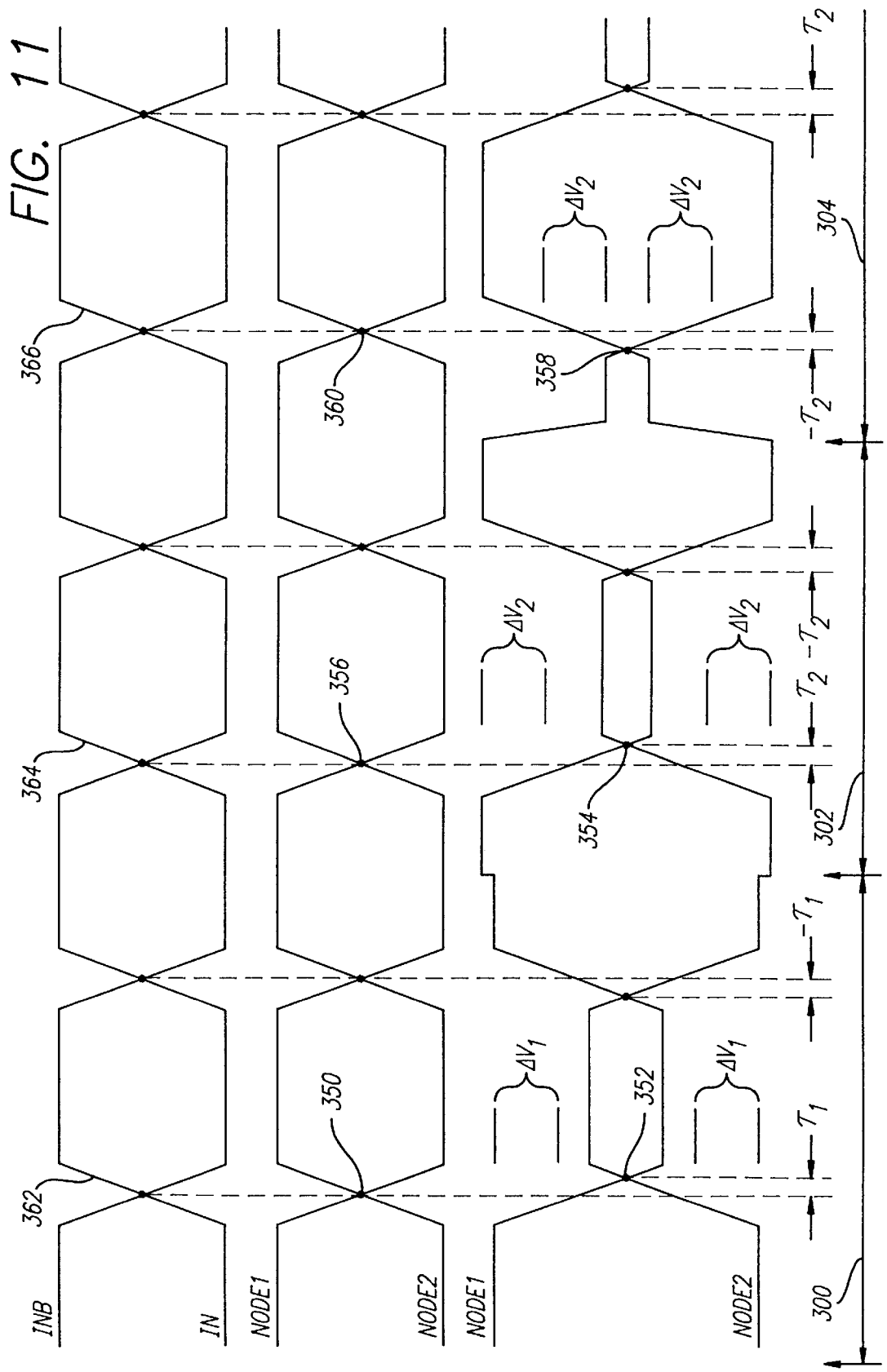
FIG. 11 is an illustration of the waveforms occurring in the delay cell of FIG. 9 without feedback from the output of the cell to the control input.

The first two waveforms of FIG. 11 illustrate the relationship of these four waveforms. Of course, there will be a nominal delay between the input and output voltages the magnitude of which will be predominantly influenced by the capacitive load on NODE1 and NODE2, and the gain of the differential input. This delay is not shown between the waveforms of FIG. 11 to make illustration of the preferred embodiment easier.

Transistor JEb 240 is a constant current source which draws I0, the magnitude of which is a function of the value of VREF and Rb 238. Transistors JE4 224 and JE3 220 are current sources that source current I1 and I2 respectively which in sum always equal I0. The magnitudes of I1 and I2 are governed by the voltages on VANB and VAN respectively.

Transistor pair JD5 216/JD6 214 determines from which node (i.e. NODE1 270 or NODE2 272) the current I1 will be drawn. Likewise, transistor pair JD7 218 and JD8 220 determines from which node I2 will be drawn. The switching of the currents is determined by the logical outputs from XOR gate 202. When the Q output 280 of XOR gate 202 is a logic high, I1 is drawn from NODE1 270 and I2 from NODE2 270. The opposite is true when the value or the Q output of XOR gate 202 is a logic low.

The currents I1 and I2 are used to create additional voltage drops across resistors RD1 212 and RD2 210 (RD1=RD2). When the voltage on VANB=VAN, I1=I2 (RS1 244 equals RS2 242) and the additional voltage drops across RD1 212 and RD2 210 are equal. Thus, the waveforms on NODE1 270 and NODE2 272 will be shifted by an equal DC offset and their crossing points remain roughly the same. The second set of waveforms shown in FIG. 11 illustrate the relative positions of the waveforms on NODE1 and NODE2 when VAN=VANB.

As VAN is made more positive than VANB, I2 becomes greater than I1. Because I1+I2 must equal I0 which is constant, I1 must decrease by an amount equal to the amount by which I2 increases. Thus, when the output Q 280 is a logical zero, the voltage drop across RD1 will decrease by an amount equal to the amount by which the voltage drop across RD2 increases. The magnitude of the voltage drops will be reversed when the output Q 280 is a logic one.

If the feedback signals FBout 286 and FBoutB 284, which are input to XOR gate 202, are ignored for the time being, and it is assumed that the signals on output Q 280 and QB 282 are the same as the signals on D 264 and DB 266, the third set of waveforms of FIG. 11 illustrate the resulting DC shift experienced by the waveforms on NODE1 270 and NODE2 272 when the voltage on VAN 250 is greater than the voltage on VANB 248.

The time segment 300 of FIG. 11 illustrates the NODE1 and NODE2 waveforms when XOR gate output Q 280 is high. (In accordance with above-noted assumption, this corresponds to when the input D 264 is high, programming the cell to produce its maximum delay $\tau_{maxC}$.) The waveform on NODE1 shifts up by $\Delta V1$ relative to its position when VAN=VANB because the voltage drop across RD2 has increased.

As can be seen by comparing the crossing point 350 of the second set of waveforms and the crossing point 352 of the third set of waveforms, the crossing point 352 has been advanced by $\tau_1$ with respect to crossing point 350. Time segment 302 illustrates the effect of increasing the voltage differential between VAN 250 and VANB 248. The two waveforms move further apart, deviating from their original positions by $\Delta V2$. As can be seen, crossover point 354 has been advanced by $\tau_2$ with respect to crossover point 356, which is greater than $\tau_1$. Thus, $\tau$ may be tuned using the voltages applied to VAN 250 and VANB 248.

Time segment 306 illustrates the effect on the NODE1 and NODE2 waveforms when the output Q 280 of XOR gate 202 becomes low. (In accordance with the above-noted assumption, this corresponds to when D 264 is at a logic low to program the cell to produce a minimum delay $\tau_{minC}$.) In this case, the waveform on NODE1 shifts down by $\Delta V2$ relative to its position when VAN=VANB, and the waveform on NODE2 shifts up by $\Delta V2$ relative to its position when VAN=VANB. As can be seen in FIG. 11, crossing point 358 has been retarded by $-\tau_2$ with respect to crossing point 360.

The waveforms on NODE1 270 and NODE2 272 are then fed into a source-follower output stage which buffers the waveforms to provide increased current gain. As previously discussed, although it is only the crossing points that have been advanced or retarded, because the differential input of the next stage only amplifies the difference in the two signals output from OUT 256 and OUTB 258, the differential amplifier will switch at those crossing points thereby imposing the delay on the incoming waveform. Of course, the propagation delay through the source-follower will also contribute to the nominal delay ($\tau_{nom}$) of the cell.

The nominal delay $\tau_{nom}$, imposed on any timing edge due to circuit propagation delays, will typically be much greater in magnitude than the programmable delays. Thus, even though the timing edge 366 has been retarded by $-\tau_2$, the overall delay $\tau_{minC}$ experienced by timing edge 366 will be positive in sign when combined with the nominal delay it experiences in propagating through the cell. The third set of waveforms of FIG. 11 result when the preferred embodiment of the cell of the present invention is programmed with just the D 264 and DB 266 inputs (i.e. without the benefit of the feedback into the XOR gate 202).

As illustrated by FIG. 11, when the control signal is a logical one to program the cell to produce $\tau_{maxC}$, the crossing point of the falling edges (or non-timing edges) of the waveforms seen on NODE1 and NODE2 experience a negative delay which is equal in magnitude but opposite in sign to that imposed on the crossing point of their timing edges. Thus, the timing edge is advanced by $\tau$, but the non-timing edge is retarded by $-\tau$. This shrinks the time during which the waveform is high $T_h$ by $2\tau$. If the delay line is sufficiently long, and $\tau_{maxC}$ is programmed for each of the cells, the timing edge could eventually be swallowed as $T_h$ approaches Zero. If the control signal from output Q 280 is low, thus programming the cell to produce $\tau_{minC}$, the falling edge will be advanced by $\tau$ while the rising edge is retarded by $-\tau$. Thus, the same problem can occur in either delay state.

The feedback signals from the source-follower output stage, FBout 284 and FBoutB 286, when combined with the signals on input D 264 and input DB 266 as inputs to XOR gate 202, solves this problem. The XOR gate actually inverts the control signal in the middle of each period of the incoming waveform so that the non-timing edge will receive the opposite treatment as that received by the timing edge. Thus, when $\tau_{maxC}$ is programmed, both crossing points will be advanced. When $\tau_{minC}$ is programmed, both crossing points will be retarded. With both crossing points being shifted in the same direction, the duty cycle of the waveform will remain virtually unaffected.

Figure 12:
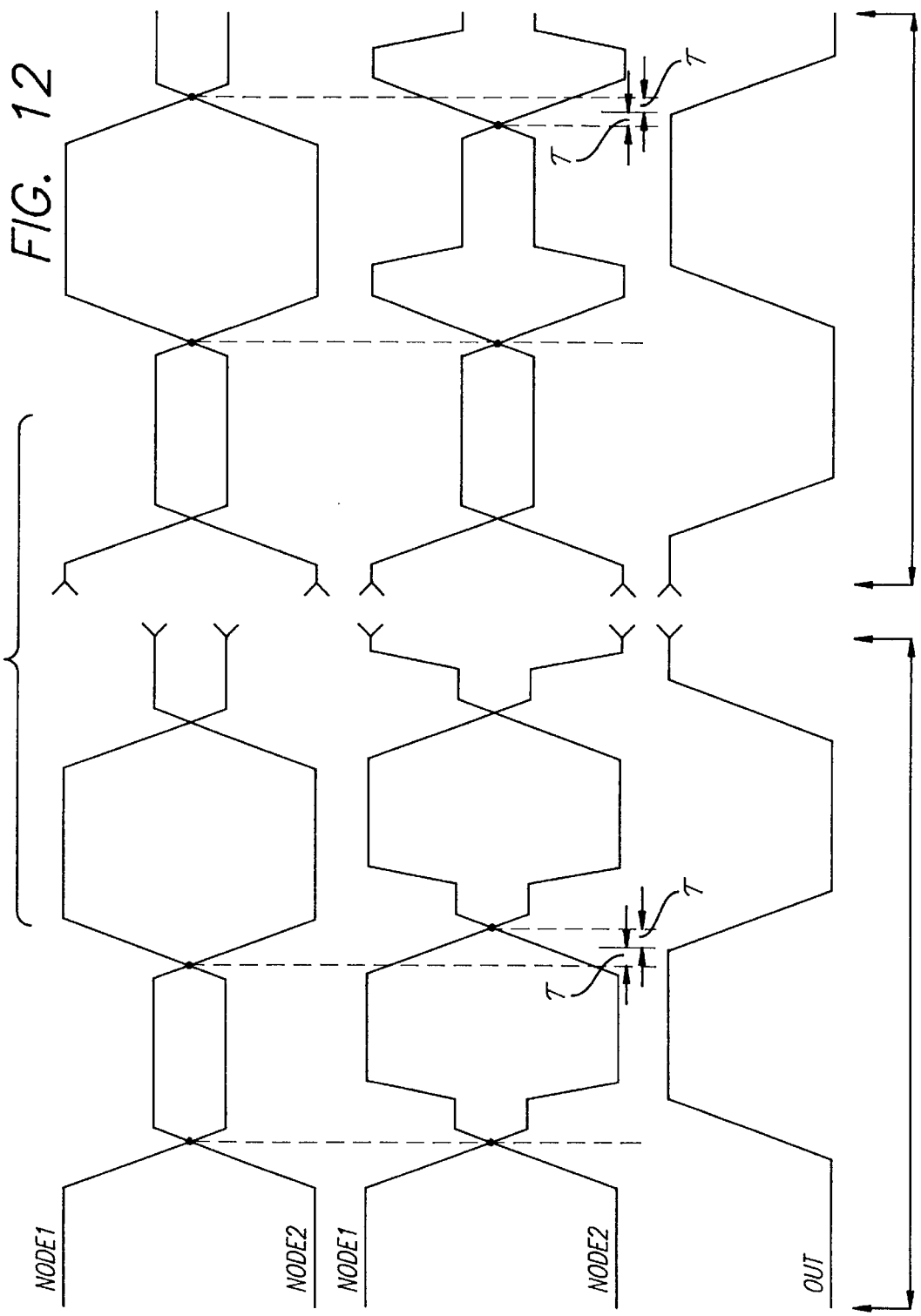
FIG. 12 is an illustration of the waveforms occurring in the delay cell of FIG. 9 with feedback from the output of the cell to the control input.

FIG. 12 illustrates the effect on the waveforms on NODE1 and NODE2 (and thus on OUT 256, OUTB 258, FBout 284 and FBoutB 286), with implementation of the feedback through XOR gate 202. Time segment 380 illustrates the scenario when the input D 264 is a binary one and timing segment 382 illustrates when input D 264 is a binary zero. In the case of time segment 380, both crossover points (i.e. those associated with the timing and non-timing edges) are advanced by $\tau$ when the cell is programmed to produce $\tau_{maxC}$. Time segment 382 illustrates that both crossing points are retarded by $-\tau$ when the cell is programmed to produce $\tau_{minC}$.

When the cell is programmed to produce $\tau_{maxC}$ (i.e. D=1), the timing edge is therefore delayed by a $\tau=2\Delta v(dt/dv)$, where dv/dt is the slew rate of the differential input pair and $\Delta V$ is the DC offset experienced by each of the waveforms on NODE1 270 and NODE2 272.

$$\Delta v = (I2 - I1)(RD) = \frac{VAN - VANB}{RS} (RD),$$

where RD is the value of each of the resistors RD1 212 and RD2 210, and RS is the value of each of the resistors RS1 244 and RS2 242. Thus $$\tau = 2(dt/dv)(RD)\frac{(VAN - VANB)}{RS}.$$

Because the delay $\tau$ is directly proportional to the difference in currents I1 and I2 created by the difference in tuning voltages VAN and VANB, the delay $\tau$ is independent of the value of the reference current I0. Each cell produces a $\tau_{maxC}$ and a $\tau_{minC}$ that are symmetrical about $\tau_{nom}$ (i.e. $\tau_{maxC}=\tau_{nom}+\tau_i\tau_{minC}=\tau_{nom-\tau}$). Thus, the core cell provides very fine control over the value of $\tau$, even permitting $\tau_{maxC}-\tau_{minC}=\tau_{netC}$ to be zero or even negative in value.

Figure 13:
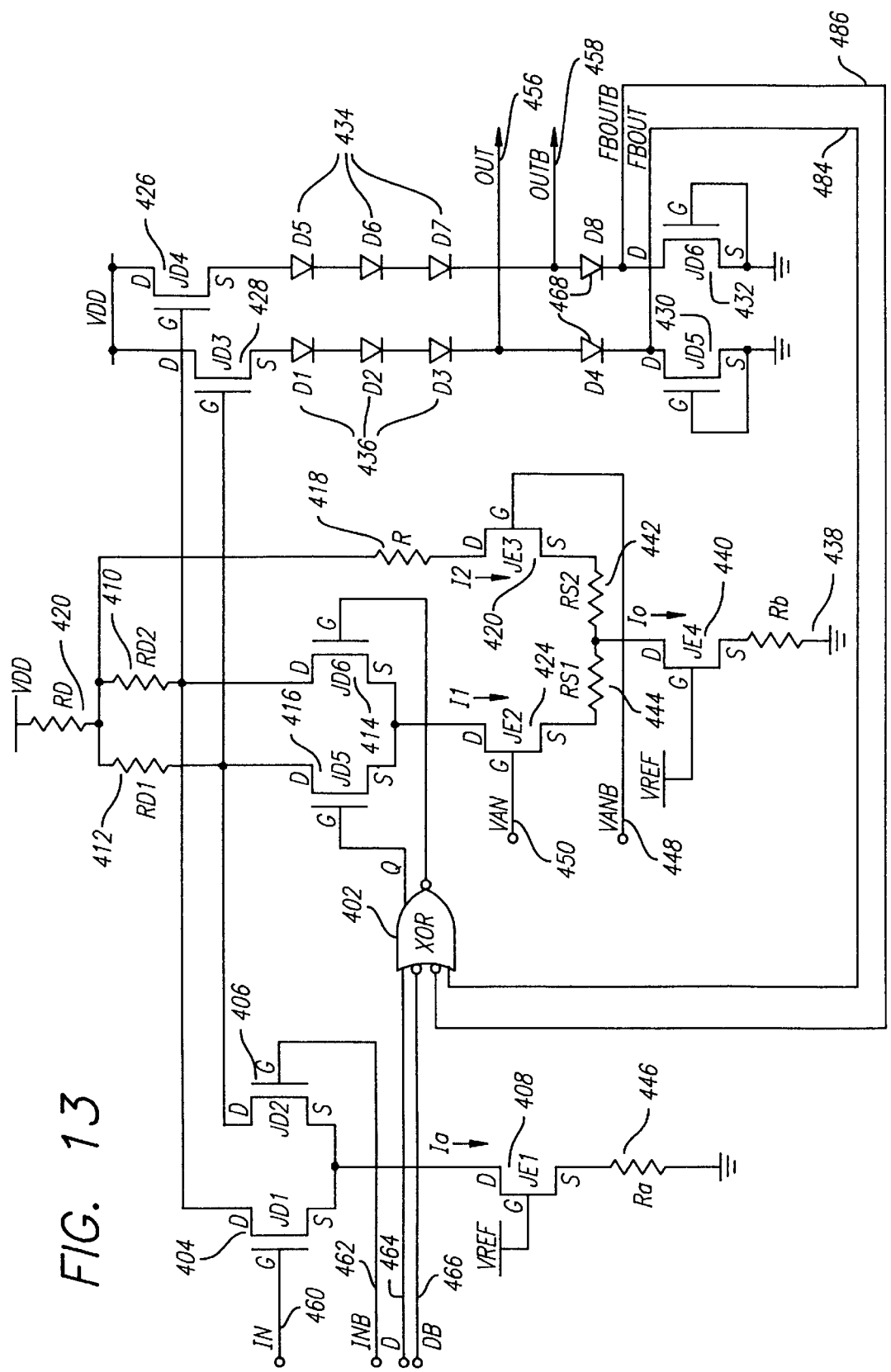
FIG. 13 is an alternate preferred embodiment of a delay cell of the present invention that can be used to implement the series delay generator of the present invention.

A second preferred embodiment of a cell of the invention is shown in FIG. 13. This cell operates in virtually the same manner as the first preferred embodiment, except that only one of the nodes has current drawn from it under control of the XOR gate 202. Thus only one of the waveforms on NODE1 470 or NODE2 472 is shifted down by an increased voltage drop across RD1 412 or RD2 410. The other waveform remains constant.

The delay imposed by this cell is $\tau=2\Delta v(dt/dv)$ where dv/dt is the slew rate of the differential input pair and where $$\Delta v = \pm \left[ \left( \frac{VAN - VANB}{(2)RS} \right) + \frac{I0}{2} \right] RD.$$

RS=RS1=RS2 This embodiment of a cell is preferred when longer delays are required because there is no balancing current being drawn from the node (i.e. NODE1 470 or NODE2 472) from which $I_1$ is not being drawn. Thus, the change in relative offset voltage is greater and so is the resulting delay. The net delay of the cell $\tau_{netC}$ is always greater than zero, however unlike the first preferred embodiment of a cell of the present invention, which can be zero or negative. This cell is also preferred for higher speed applications because there is less capacitive load on bandwidth critical nodes NODE1 470 and NODE2 472.

Figure 14:
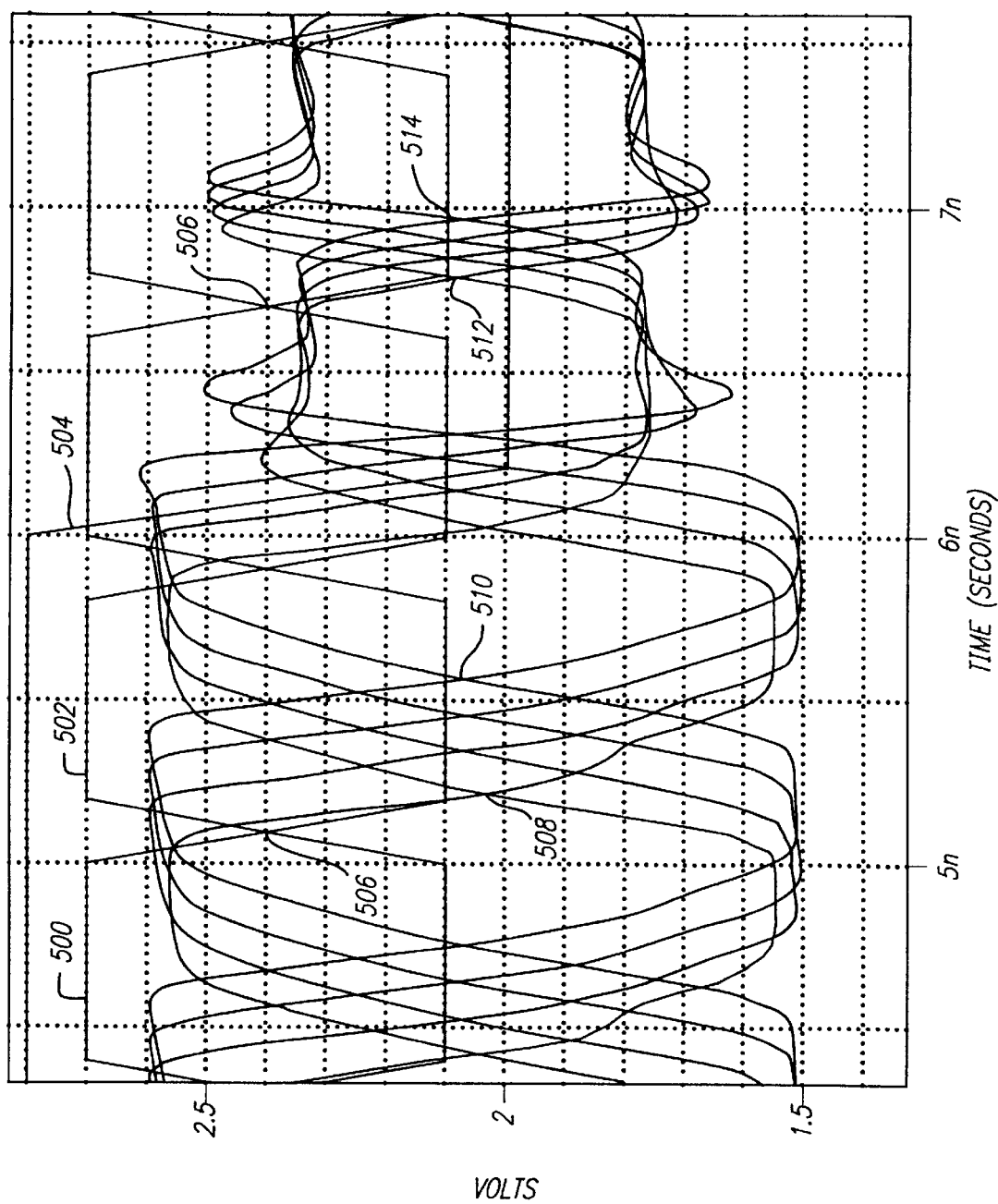
FIG. 14 is a SPICE simulation output illustrating the delays created by a four stage implementation of the series delay generator of the present invention using the delay cell shown in FIG. 9.

FIG. 14 is a spice simulation output which illustrates the outputs OUT and OUTB for a chain of four cells. FIG. 14 shows the two input waveforms IN 500 and INB 502 for the first cell, and the input 504 to the D input of each of the cells. The Figure further illustrates the OUT and OUTB outputs for each of the four stages.

The crossing points for each pair of the cell outputs illustrates the delay imposed on the input waveform by that cell. Crossing point 506 illustrates the 50% crossover point for the input waveforms IN 500 and INB 502. Crossover points 508 and 510 show the delays imposed by the first and fourth stages respectively when D equals a binary one. Crossover points 512 and 514 illustrate the delays imposed by the first and fourth stages when D equals a binary zero. The chain creates a total delay of about 450 pico seconds when D=1 for all of the cells, and produces a minimum delay of about 250 pico seconds when D=0 for all of the cells.

What is claimed:

1. An apparatus for delaying an incoming waveform, comprising:
   an input for receiving a waveform having at least one timing edge;
   a plurality of delay cells connected in series, each of said delay cells having a maximum and a minimum delay state; and
   a control circuit for decoding a programming word applied to the apparatus to determine for which of the delay cells the maximum or minimum delay states are chosen, wherein the total delay of the apparatus is dependent upon the control word.

2. The circuit of claim 1 further comprising:
   a programming word coupled to said plurality of delay cells,
   wherein said programming word represents a total delay for said at least one timing edge,
   wherein said total delay is distributed over said plurality of delay cells.

3. The circuit of claim 1 further comprising:
   a reference voltage generator coupled to said plurality of delay cells, said reference voltage generator for tuning a net delay of each of said plurality of delay cells,
   wherein said net delay is a difference between a maximum time delay and a minimum time delay.

4. The circuit of claim 1, wherein a net delay of each of said plurality of delay cells is independently tunable,
   wherein said net delay is a difference between a maximum time delay and a minimum time delay.

5. The circuit of claim 1, wherein each of said plurality of delay cells produces one of two delay states in response to a binary value of a single programming bit.

6. The circuit of claim 1 further comprising clusters,
   wherein each of said clusters includes one or more of said plurality of delay cells,
   wherein each cluster is coupled to a bit of a programming word,
   wherein a net delay for each of said plurality of delay cells is fixed, and
   wherein said net delay is a difference between a maximum time delay and a minimum time delay.

7. The circuit of claim 1, wherein a minimum retrigger time required for said plurality of delay cells is equal to a sum of all of said maximum time delays of said plurality of delay cells plus a one-bit DAC settling time of a single delay cell.

8. The circuit of claim 1, wherein more than one timing edge of said incoming waveform and their programming words occupy said circuit concurrently.

9. The circuit of claim 1 further comprising:
   a plurality of segments each of which includes one or more of said plurality of delay cells; and
   a plurality of fixed delay elements,
   wherein said plurality of segments are coupled in series,
   wherein said fixed delay elements are interposed between an output of a segment and an input of a next segment, and
   wherein only one timing edge occupies one of said plurality of segments at a time.

10. The circuit of claim 9, wherein programming data is self-clocked with its associated timing edge to advance said programming data to a next segment.

11. The circuit of claim 1 further comprising a veractor.

12. A method for delaying an incoming waveform, said incoming waveform entering a circuit having a plurality of delay cells, said method comprising the steps of:
   receiving, as an input of each of said plurality of delay cells, a waveform having at least one timing edge;
   imposing a maximum time delay on said at least one timing edge when said cell receiving said at least one timing edge is in a maximum delay state;
   imposing a minimum time delay on said at least one timing edge when said cell receiving said at least one timing edge is in a minimum delay state; and
   providing, as an output of each of said plurality of delay cells, said at least one timing edge delayed by said maximum time delay when said cell is in said maximum delay state and delayed by said minimum time delay when said cell is in said minimum delay state,
   wherein said plurality of delay cells is connected in series such that the input of a first of said series is coupled to said incoming waveform and the input of a second of said series is coupled to the output of said first and so on.

13. The method of claim 12, wherein said circuit further comprises a programming word coupled to said plurality of delay cells,
   wherein said programming word represents a total delay for said at least one timing edge, said method further comprising the step of:
distributing said total delay over said plurality of delay cells.

14. The method of claim 12, wherein said circuit further comprises a reference voltage generator coupled to said plurality of delay cells,
said method further comprising the step of:
tuning a net delay of each of said plurality of delay cells,
wherein said net delay is a difference between a maximum time delay and a minimum time delay.

15. The method of claim 12, wherein each of said plurality of delay cells produces one of two delay states in response to a binary value of a single programming bit.

16. The method of claim 12, wherein said circuit further comprises clusters,
wherein each of said clusters includes one or more of said plurality of delay cells,
wherein each cluster is coupled to a bit of a programming word,
said method further comprising the step of:
fixing a net, delay for each of said plurality of delay cells,
wherein said net delay is a difference between a maximum time delay and a minimum time delay.

17. The method of claim 12, wherein a minimum retrigger time required for said plurality of delay cells is equal to a sum of all of said maximum time delays of said plurality of delay cells plus a one-bit DAC settling time of a single delay cell.

18. The method of claim 12, wherein more than one timing edge of said incoming waveform and their programming words occupy said circuit concurrently.

19. The method of claim 12, wherein said circuit further comprises:
a plurality of segments each of which includes one or more of said plurality of delay cells; and
a plurality of fixed delay elements,
wherein said plurality of segments are coupled in series,
wherein said fixed delay elements are interposed between an output of a segment and an input of a next segment, and
wherein only one timing edge occupies one of said plurality of segments at a time.

20. The method of claim 19, wherein programming data is self-clocked with its associated timing edge to advance said programming data to a next segment.

* * * * *